(12) United States Patent
Lee et al.

(10) Patent No.: US 11,901,374 B2
(45) Date of Patent: Feb. 13, 2024

(54) DISPLAY DEVICE AND METHOD OF MANUFACTURING THE SAME

(71) Applicant: Samsung Display Co., LTD., Yongin-si (KR)

(72) Inventors: Hang Jae Lee, Yongin-si (KR); Yuk Hyun Nam, Yongin-si (KR); Sung Jae Yun, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 76 days.

(21) Appl. No.: 17/674,360

(22) Filed: Feb. 17, 2022

(65) Prior Publication Data

US 2022/0262827 A1  Aug. 18, 2022

(30) Foreign Application Priority Data

Feb. 18, 2021  (KR) .................. 10-2021-0022172

(51) Int. Cl.
*H01L 27/12* (2006.01)
*H01L 25/16* (2023.01)
*H01L 33/44* (2010.01)
*H01L 23/00* (2006.01)

(52) U.S. Cl.
CPC .......... *H01L 27/1244* (2013.01); *H01L 24/95* (2013.01); *H01L 25/167* (2013.01); *H01L 27/1259* (2013.01); *H01L 24/24* (2013.01); *H01L 33/44* (2013.01); *H01L 2224/24051* (2013.01); *H01L 2224/24147* (2013.01); *H01L 2224/95101* (2013.01); *H01L 2224/95133* (2013.01)

(58) Field of Classification Search
None
See application file for complete search history.

(56) References Cited

U.S. PATENT DOCUMENTS

| 2019/0214376 | A1 | 7/2019 | Kim |
| 2020/0203587 | A1 | 6/2020 | Kim et al. |
| 2020/0258938 | A1 | 8/2020 | Chai et al. |
| 2021/0376210 | A1 | 12/2021 | Lee et al. |
| 2021/0384169 | A1 | 12/2021 | Lee et al. |
| 2021/0398952 | A1 | 12/2021 | Zhang et al. |
| 2022/0052032 | A1 | 2/2022 | Li et al. |
| 2022/0181522 | A1 | 6/2022 | Moon et al. |

FOREIGN PATENT DOCUMENTS

| KR | 10-2019-0085197 A | 7/2019 |
| KR | 10-2020-0070493 A | 6/2020 |
| KR | 10-2020-0078398 A | 7/2020 |
| KR | 10-2020-0097869 A | 8/2020 |
| KR | 10-2020-0121956 A | 10/2020 |
| KR | 10-2021-0149292 A | 12/2021 |
| KR | 10-2021-0150642 A | 12/2021 |
| WO | WO 2020/215502 A1 | 10/2020 |

*Primary Examiner* — Bo B Jang
(74) *Attorney, Agent, or Firm* — Lewis Roca Rothgerber Christie LLP

(57) ABSTRACT

A display device in accordance with some embodiments may include a substrate, a first interlayer insulating layer on the substrate, a data conductor on the first interlayer insulating layer, a passivation layer on the data conductor, a pixel electrode layer on the passivation layer, and a shielding electrode between the data conductor and the pixel electrode layer, and defining a first contact opening and a second contact opening, wherein the data conductor and the pixel electrode layer are electrically coupled to each other in each of the first contact opening and the second contact opening.

20 Claims, 18 Drawing Sheets

FIG. 1
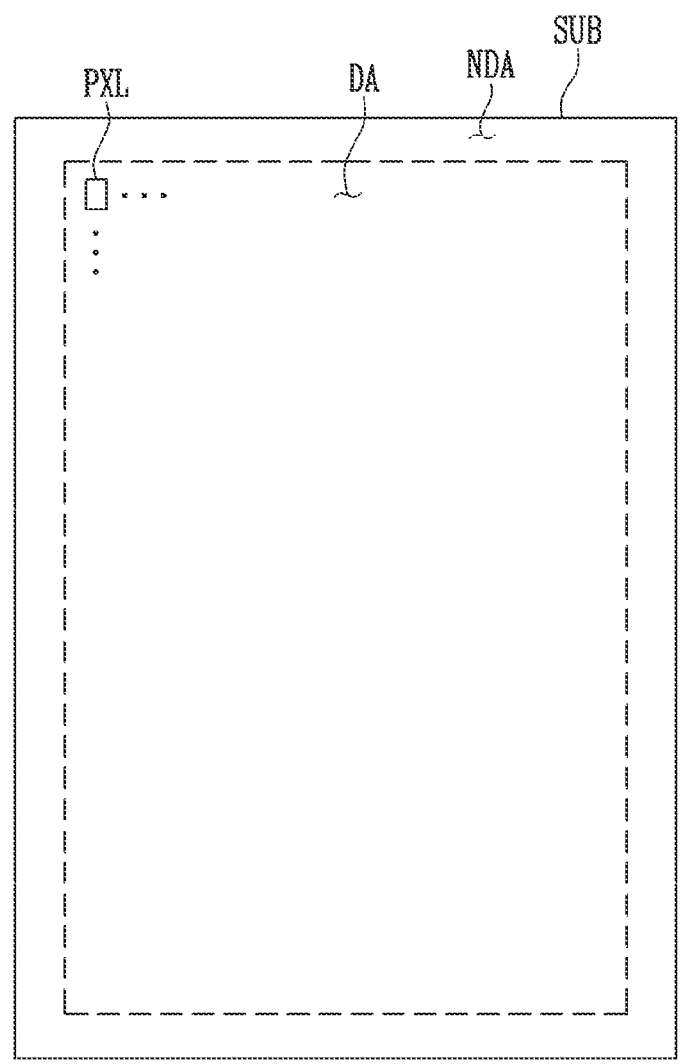
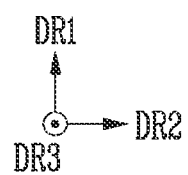

DISPLAY DEVICE AND METHOD OF MANUFACTURING THE SAME

CROSS-REFERENCE TO RELATED APPLICATION

The application claims priority to, and the benefit of, Korean patent application number 10-2021-0022172 filed on Feb. 18, 2021, in the Korean Intellectual Property Office, the entire disclosure of which is incorporated herein in its entirety by reference.

BACKGROUND

1. Field

Various embodiments of the present disclosure relate to a display device and a method of fabricating the display device.

2. Description of Related Art

With an increase in interest in an information display, and with an increase in demand to use portable information media, demand for display devices is markedly increased, and commercialization thereof is in progress.

SUMMARY

Various embodiments of the present disclosure are directed to a display device capable of mitigating a deviation in alignment of light emitting elements, and a method of manufacturing the display device.

A display device in accordance with some embodiments may include a substrate, a first interlayer insulating layer on the substrate, a data conductor on the first interlayer insulating layer, a passivation layer on the data conductor, a pixel electrode layer on the passivation layer, and a shielding electrode between the data conductor and the pixel electrode layer, and defining a first contact opening and a second contact opening, wherein the data conductor and the pixel electrode layer are electrically coupled to each other in each of the first contact opening and the second contact opening.

The data conductor may include a drain electrode of a first transistor, and a driving voltage line, wherein the pixel electrode layer includes a first electrode and a second electrode, wherein, in the first contact opening, the drain electrode of the first transistor and the first electrode are electrically coupled to each other through a first contact hole, and wherein, in the second contact opening, the driving voltage line and the second electrode are electrically coupled to each other through a second contact hole.

The display device may further include a second interlayer insulating layer between the first interlayer insulating layer and the passivation layer, wherein the second interlayer insulating layer covers the first interlayer insulating layer and the data conductor, and wherein the shielding electrode is between the second interlayer insulating layer and the passivation layer.

The passivation layer may define a 1-1-th contact hole and a 2-1-th contact hole, wherein the second interlayer insulating layer defines a 1-2-th contact hole and a 2-2-th contact hole, wherein the first contact hole includes the 1-1-th contact hole and the 1-2-th contact hole, and wherein the second contact hole includes the 2-1-th contact hole and the 2-2-th contact hole.

The display device may further include a second interlayer insulating layer between the first interlayer insulating layer and the passivation layer, and covering the first interlayer insulating layer and the data conductor, wherein the shielding electrode is between the passivation layer and the pixel electrode layer.

The display device may further include a light emitting element between the first electrode and the second electrode, and having a first end electrically coupled with the first electrode, and a second end electrically coupled with the second electrode.

In a sectional view, the shielding electrode may further include an emission opening at least partially overlapping with the light emitting element.

The shielding electrode may include a first part and a second part around the emission opening, the first part being electrically coupled with the first electrode, and the second part being electrically coupled with the second electrode.

A display device in accordance with some embodiments may include a substrate including an emission area and a non-emission area, a first interlayer insulating layer on the substrate, a data conductor on the first interlayer insulating layer, a passivation layer on the data conductor, a pixel electrode layer on the passivation layer, and a shielding electrode between the data conductor and the pixel electrode layer, defining a first contact opening and a second contact opening, and located in the emission area and the non-emission area except the first contact opening and the second contact opening.

The data conductor may include a drain electrode of a first transistor and a driving voltage line, wherein the pixel electrode layer includes a first electrode and a second electrode, wherein, in the first contact opening, the drain electrode of the first transistor and the first electrode are electrically coupled to each other through a first contact hole, and wherein, in the second contact opening, the driving voltage line and the second electrode are electrically coupled to each other through a second contact hole.

In a plan view, the first contact opening may enclose the first contact hole, wherein, in a plan view, the second contact opening encloses the second contact hole.

The display device may further include a second interlayer insulating layer between the first interlayer insulating layer and the passivation layer, and covering the first interlayer insulating layer and the data conductor, wherein the shielding electrode is between the second interlayer insulating layer and the passivation layer.

The display device may further include a second interlayer insulating layer between the first interlayer insulating layer and the passivation layer, and covering the first interlayer insulating layer and the data conductor, wherein the shielding electrode is between the passivation layer and the pixel electrode layer.

The display device may further include a light emitting element between a first electrode and a second electrode of the pixel electrode layer, wherein a first end of the light emitting element is electrically coupled with the first electrode, and wherein a second end of the light emitting element is electrically coupled with the second electrode.

In a sectional view, the shielding electrode may define an emission opening at least partially overlapping with the light emitting element.

The shielding electrode may include a first part and a second part around the emission opening, the first part being electrically coupled with the first electrode, and the second part being electrically coupled with the second electrode.

A method of manufacturing a display device in accordance with some embodiments may include forming a data conductor on a substrate, the data conductor including a drain electrode of a first transistor, and a driving voltage line, forming an interlayer insulating layer covering the data conductor, forming a shielding electrode on the interlayer insulating layer, forming a passivation layer on the shielding electrode, forming a portion of a first contact hole and a portion of a second contact hole by etching the passivation layer, forming a first contact opening and a second contact opening by etching the shielding electrode, completing formation of the first contact hole and the second contact hole by etching the interlayer insulating layer, and forming a display element layer on the passivation layer, the display element layer including a first electrode coupled to the drain electrode of the first transistor through the first contact hole in the first contact opening, and a second electrode coupled to the driving voltage line through the second contact hole in the second contact opening.

A width of the first contact opening may be greater than a width of the portion of the first contact hole, wherein a width of the second contact opening is greater than a width of the portion of the second contact hole.

The method may further include spraying a solution including a light emitting element onto the first electrode and the second electrode, and applying respective alignment voltages to the first electrode and the second electrode.

A first end of the light emitting element may be electrically coupled with the first electrode, wherein a second end of the light emitting element is electrically coupled with the second electrode.

BRIEF DESCRIPTION OF THE DRAWINGS

FIG. 1 is a plan view schematically illustrating a display device in accordance with some embodiments.

DETAILED DESCRIPTION

Figure 2:
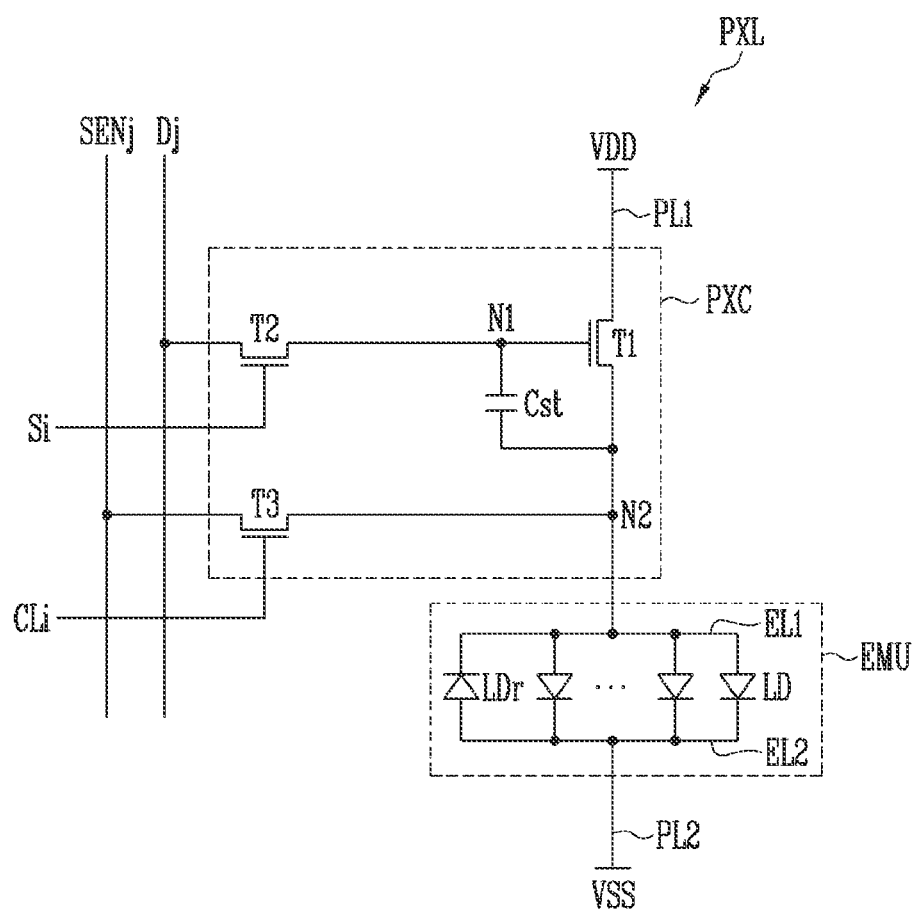
FIG. 2 is a circuit diagram illustrating components included in a pixel of the display device in accordance with some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g., an application-specific integrated circuit), software, or a combination of software, firmware, and hardware, to process data or digital signals. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Circuit hardware may include, for example, application specific integrated circuits (ASICs), general purpose or special purpose central processing units (CPUs) that is configured to execute instructions stored in a non-transitory storage medium, digital signal processors (DSPs), graphics processing units (GPUs), and programmable logic devices such as field programmable gate arrays (FPGAs).

Further, the various components of these devices may be a process or thread, running on one or more processors, in one or more computing devices, executing computer program instructions and interacting with other system components for performing the various functionalities described herein. The computer program instructions are stored in a memory that may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view schematically illustrating a display device in accordance with some embodiments.

Referring to FIG. 1, the display device in accordance with some embodiments may include a substrate SUB, and a plurality of pixels PXL provided on the substrate SUB.

The substrate SUB may be formed of a rigid substrate or a flexible substrate, and may be formed of a substrate including transparent insulating material to allow light to transmit therethrough. For example, the rigid substrate SUB may be one of a glass substrate, a quartz substrate, a glass ceramic substrate, and a crystalline glass substrate. The flexible substrate may be either a film substrate or a plastic substrate that includes polymer organic material.

The substrate SUB may include a display area DA that displays an image, and a non-display area NDA that does not display an image.

The display area DA may be an area, which is provided on approximately the entirety of a front surface of the substrate SUB, and in which the plurality of pixels PXL are provided. The pixel PXL may include at least one light emitting element LD (refer to FIGS. 2 to 4), which is driven by a signal (e.g., a scan signal and a data signal) and/or a power supply (e.g., a first driving power supply and a second driving power supply). The light emitting element LD may form a light source of each pixel PXL. The light emitting element LD may have a small size corresponding to the nanometer scale to the micrometer scale, and may be coupled in parallel to light emitting elements LD located adjacent thereto, but the present disclosure is not limited thereto.

The non-display area NDA may be an area that encloses the display area DA, and in which a driver that is configured to drive the pixels PXL, a line component four coupling the pixels PXL with the driver, and a plurality of pads are provided. The driver may provide a signal (e.g., predetermined signal) and a power voltage (e.g., predetermined power voltage) to each pixel PXL through the line component, and may thus control the operation of the pixel PXL. The driver may include a scan driver, an emission driver, a data driver, and a timing controller. The line component may electrically couple the driver with the pixels PXL. The line component may be a fan-out line coupled with signal lines (e.g., a scan line, a data line, and an emission control line), which are coupled to each pixel PXL to provide signals to the pixel PXL. Furthermore, the line component may be a fan-out line coupled to signal lines (e.g., a control line and a sensing line), which are coupled to each pixel PXL to compensate in real time for variation in electrical characteristics of the pixel PXL. The plurality of pads may be located on one side of the display device, and may be coupled to a circuit substrate (e.g., a flexible printed circuit board (FPCB) provided to transmit signals and voltages from an external device through the line components.

Although FIG. 1 illustrates only one pixel PXL, a plurality of pixels PXL may be provided in the display area DA. In some embodiments, the pixels PXL may be arranged in the display area DA in a stripe or PENTILE® arrangement manner (e.g., a PENTILE® matrix structure, an RGBG structure, or a PENTILE® structure, PENTILE® being a registered trademark of Samsung Display Co., Ltd., Republic of Korea).

The display device DD in accordance with some embodiments may be applied to an electronic device having a display surface on at least one surface thereof (e.g., a smartphone, a television, a tablet PC, a mobile phone, a video phone, an electronic reader, a desktop PC, a laptop PC, a netbook computer, a workstation, a server, a PDA, a portable multimedia player (PMP), an MP3 player, a medical appliance, a camera, or a wearable device).

Furthermore, although the display device in accordance with some embodiments has been illustrated as having a rectangular shape including two pairs of sides respectively parallel to each other, the present disclosure is not limited thereto. In some embodiments, the display device may be formed in various shapes such as a rectangular shape having rounded corners, a square shape, and a circular shape.

Hereinafter, a connection relationship of components of a pixel of the display device in accordance with some embodiments will be described with reference to FIG. 2.

FIG. 2 is a circuit diagram illustrating components included in a pixel of the display device in accordance with some embodiments.

Referring to FIG. 2, a pixel PXL in accordance with some embodiments may include a pixel circuit PXC and an emission unit EMU. The pixel circuit PXC may include a first transistor T1, a second transistor T2, a third transistor T3, and a capacitor Cst. The emission unit EMU may include at least one light emitting element LD.

The first transistor T1 may be a driving transistor configured to control driving current to be applied to the emission unit EMU, and may be coupled between the first driving power supply VDD and the emission unit EMU. In detail, a first electrode of the first transistor T1 may be coupled to the first driving power supply VDD through a first power line PL1. A second electrode of the first transistor T1 may be coupled to a second node N2. A gate electrode of the first transistor T1 may be coupled to a first node N1. Hence, the first transistor T1 may control, in response to a voltage applied to the first node N1, driving current to be applied from the first driving power supply VDD to the emission unit EMU through the second node N2. In some embodiments, the first electrode of the first transistor T1 may be a drain electrode, and the second electrode of the first transistor T1 may be a source electrode, and the present disclosure is not limited thereto. In other embodiments, the first electrode may be the source electrode, and the second electrode may be the drain electrode.

The second transistor T2 may be a switching transistor that selects a pixel PXL in response to a scan signal and that activates the pixel PXL, and may be coupled between a data line Dj and the first node N1. In detail, a first electrode of the second transistor T2 may be coupled to the data line Dj. A second electrode of the second transistor T2 may be coupled to the first node N1. A gate electrode of the second transistor T2 may be coupled to a scan line Si. When a scan signal having a gate-on voltage (e.g., a high level voltage) is supplied from the scan line Si, the second transistor T2 may be turned on to electrically couple the data line Dj and the first node N1. The first node N1 may be a point at which the second electrode of the second transistor T2 and the gate electrode of the first transistor T1 are coupled to each other. The second transistor T2 may transmit a data voltage to the gate electrode of the first transistor T1.

The third transistor T3 may be a sensing transistor configured to perform an external compensation for the pixel PXL, and may be coupled between a sensing line SENj and the emission unit EMU. In detail, a first electrode of the third transistor T3 may be coupled to the sensing line SENj. A second electrode of the third transistor T3 may be coupled to the second node N2. A gate electrode of the third transistor T3 may be coupled to a sensing control line CLi. When a sensing control signal having a gate-on voltage (e.g., a high level voltage) is supplied from the sensing control line CLi, the third transistor T3 may be turned on to electrically couple the sensing line SENj and the emission unit EMU.

The third transistor T3 may provide a sensing signal through the sensing line SENj by coupling the first transistor T1 to the sensing line SENj, and, by, using the sensing signal, may enable the detection of characteristics of each pixel PXL including a threshold voltage of the first transistor T1, etc. Information about the characteristics of each pixel PXL may be used to convert image data such that a deviation in characteristic between pixels PXL may be compensated.

Furthermore, the first electrode of the third transistor T3 may be coupled to an initialization power supply. The third transistor T3 may be an initialization transistor configured to initialize the second node N2, and may transmit an initialization voltage to the second node N2 when turned on by a sensing control signal. Hence, a second storage electrode of the storage capacitor Cst coupled to the second node N2 may be initialized.

A first storage electrode of the storage capacitor Cst may be coupled to the first node N1. A second storage electrode of the storage capacitor Cst may be coupled to the second node N2. The storage capacitor Cst may charge a data voltage corresponding to a data signal to be supplied to the first node N1 during one frame period. Hence, the storage capacitor Cst may store a voltage corresponding to a difference between a voltage of the gate electrode of the first transistor T1 and a voltage of the second node N2.

The emission unit EMU may include a first electrode EL1, a second electrode EL2, and a plurality of light emitting elements LD coupled between the first electrode EL1 and the second electrode EL2.

The first electrode EL1 (or a first alignment electrode) may be coupled to the first driving power supply VDD via the first power line PL1 and the first transistor T1. The second electrode EL2 (or a second alignment electrode) may be coupled to the second driving power supply VSS through a second power line PL2. In some embodiments, the first electrode EL1 may be an anode, and the second electrode EL2 may be a cathode. The present disclosure is not limited thereto, and the first electrode EL1 may be a cathode, and the second electrode EL2 may be an anode.

The light emitting elements LD of the emission unit EMU may emit light having a luminance corresponding to driving current supplied thereto through the first transistor T1. The driving current supplied to the emission unit EMU may be divided into parts that flow into the respective light emitting elements LD. Hence, each of the light emitting elements LD may emit light having a luminance corresponding to current applied thereto, so that the emission unit EMU may emit light having a luminance corresponding to the driving current.

Each of the light emitting elements LD included in the emission unit EMU may include a first end coupled to the first driving power supply VDD through the first electrode EL1, and a second end coupled to the second driving power supply VSS through the second electrode EL2.

The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first driving power supply VDD and the second driving power supply VSS may be set to a value that is equal to or greater than a threshold voltage of the light emitting elements LD during an emission period of the pixel PXL.

The light emitting elements LD that are coupled in parallel to each other in an identical direction (e.g., in a forward direction) between the first electrode EL1 and the second electrode EL2 may each form a valid light source. The valid light sources may be collected to form the emission unit EMU of the pixel PXL.

In some embodiments, the emission unit EMU may further include at least one invalid light source (e.g., a reverse light emitting element LDr), in addition to the light emitting elements LD that form the respective valid light sources. The reverse light emitting element LDr, along with the light emitting elements LD that form the valid light sources, may be coupled in parallel to each other between the first electrode EL1 and the second electrode EL2. However, the reverse light emitting element LDr may be coupled between the first electrode EL1 and the second electrode EL2 in a direction that is opposite to the direction of the other light emitting elements LD. Even when a driving voltage (e.g., a forward driving voltage) is applied between the first electrode EL1 and the second electrode EL2, the reverse light emitting element LDr remains disabled, so that current does not substantially flow through the reverse light emitting element LDr.

Although FIG. 2 illustrates some embodiments where all of the first, second, and third transistors T1, T2, and T3 are N-type transistors, the present disclosure is not limited thereto. In some embodiments, at least one of the first, second, and third transistors T1, T2, and T3 may be changed to a P-type transistor.

Furthermore, although FIG. 2 illustrates some embodiments where the emission unit EMU is coupled between the first transistor T1 and the second driving power supply VSS, the emission unit EMU may be coupled between the first driving power supply VDD and the first transistor T1 in other embodiments.

Although FIG. 2 illustrates some embodiments in which all of the light emitting elements LD that form the emission unit EMU are coupled in parallel to each other, the present disclosure is not limited thereto. In some embodiments, the emission unit EMU may include one or more serial stages respectively including a plurality of light emitting elements LD coupled in parallel to each other. In other words, the emission unit LSU may be formed of a serial/parallel combination structure.

Hereinafter, the above-mentioned light emitting element will be described with reference to FIGS. 3 and 4.

Figure 3:
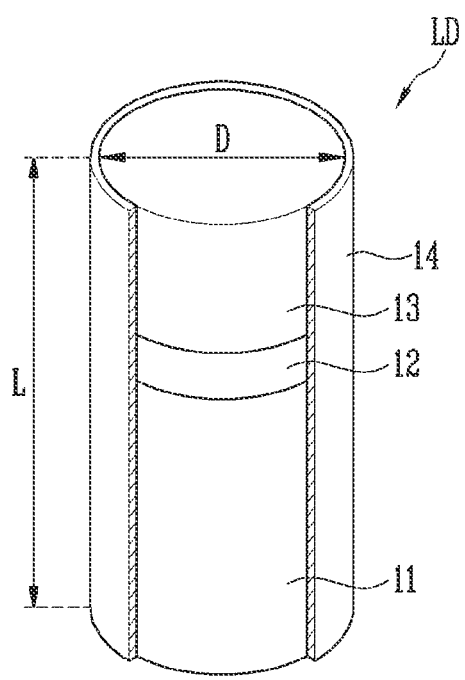
FIGS. 3 and 4 are perspective views illustrating a light emitting element included in a pixel of the display device in accordance with some embodiments.
Figure 4:
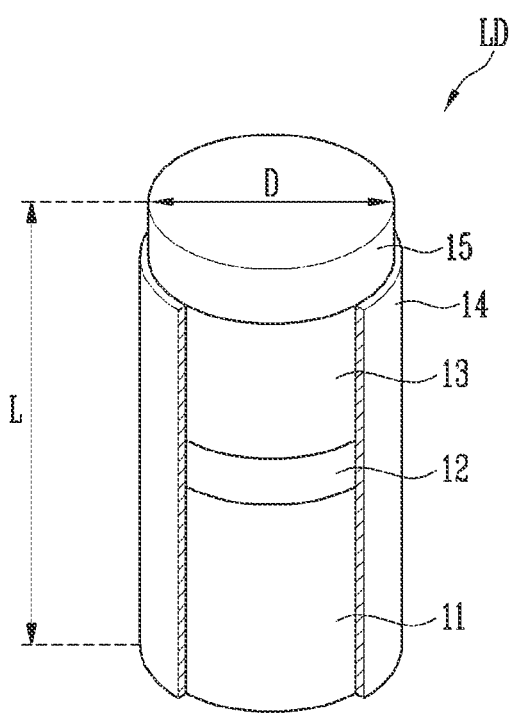

FIGS. 3 and 4 are perspective views illustrating a light emitting element included in a pixel of the display device in accordance with some embodiments.

Although FIGS. 3 and 4 illustrate a rod-type light emitting element, the type and/or shape of the light emitting element in accordance the present disclosure is not limited thereto.

Referring to FIGS. 3 and 4, the light emitting element LD in accordance with some embodiments may include a first semiconductor layer 11, an active layer 12, and a second semiconductor layer 13.

For example, the light emitting element LD may be configured of a stacked body formed by successively stacking the first semiconductor layer 11, the active layer 12, and the second semiconductor layer 13 in a longitudinal direction (L).

The first semiconductor layer 11 may include at least one n-type semiconductor layer. For instance, the first semiconductor layer 11 may include an n-type semiconductor layer that includes any one semiconductor material of InAlGaN, GaN, AlGaN, InGaN, AlN, and/or InN and that is doped with a first conductive dopant such as Si, Ge, or Sn. However, the constituent material of the first semiconductor layer 11 is not limited to the above, and the first semiconductor layer 11 may be formed of various other materials.

The active layer 12 may be located on the first semiconductor layer 11 and may have a single or multiple quantum well structure. In other embodiments, a cladding layer doped with a conductive dopant may be formed over and/or under the active layer 12. For example, the cladding layer may be formed of an AlGaN layer or an InAlGaN layer. In some embodiments, a material such as AlGaN or InAlGaN may be used to form the active layer 12, although various other materials may be used to form the active layer 12. If a voltage equal to or greater than a threshold voltage is applied between the opposite ends of the light emitting element LD, the light emitting element LD may emit light by coupling of electron-hole pairs in the active layer 12. Because light emission of the light emitting element LD may be controlled based on the foregoing principle, the light emitting element LD may be used as a light source of various light emitting devices as well as a pixel PXL of the display device.

The second semiconductor layer 13 may be located on the active layer 12 and may include a semiconductor layer having a type that is different from that of the first semiconductor layer 11. For example, the second semiconductor layer 13 may include at least one p-type semiconductor layer. For instance, the second semiconductor layer 13 may include a p-type semiconductor layer that includes any one semiconductor material of InAlGaN, GaN, AlGaN, InGaN, AlN, and/or InN, and that is doped with a second conductive dopant such as Mg, Zn, Ca, Sr, or Ba. However, the material for forming the second semiconductor layer 13 is not limited to the above, and the second semiconductor layer 13 may be formed of various other materials.

Although it has been described above that the first semiconductor layer 11 and the second semiconductor layer 13 are each formed of a single layer, the present disclosure is not limited thereto. In some embodiments, depending on the material of the active layer 12, the first semiconductor layer 11 and/or the second semiconductor layer 13 may further include one or more layers, for example, a clad layer and/or a tensile strain barrier reducing (TSBR) layer. The TSBR layer may be a strain relief layer of which a lattice structure is located between other semiconductor layers so that the strain relief layer functions as a buffer layer to reduce a difference in lattice constant. Although the TSBR layer may be formed of a p-type semiconductor layer such as p-GaInP, p-AlInP, or p-AlGaInP, the present disclosure is not limited thereto.

If the direction in which the light emitting element LD extends is defined as a longitudinal direction (L), the light emitting element LD may have a first end and a second end with respect to the longitudinal direction (L). In some embodiments, one of the first semiconductor layer 11 and the second conductive semiconductor layer 13 may be located on the first end of the light emitting element LD, and the other of the first semiconductor layer 11 and the second conductive semiconductor layer 13 may be located on the second end of the light emitting element LD.

In some embodiments, the light emitting element LD may have a small size ranging from the nanometer scale to the micrometer scale. Each light emitting element LD may have a diameter D and/or a length L ranging from the nanometer scale to the micrometer scale.

In some embodiments, the light emitting element LD may be a rod-type light emitting diode manufactured in the form of a rod. In this specification, the term "rod-type" embraces a rod-like shape and a bar-like shape, such as a cylindrical shape and a prismatic shape extending in a longitudinal direction (e.g., to have an aspect ratio greater than 1), and the cross-sectional shape thereof is not limited to any particular shape. For example, the length L of the light emitting element LD may be greater than a diameter D thereof (or a width of the cross-section thereof).

In some embodiments, the light emitting element LD may further include an insulating layer 14 provided on a surface of the light emitting element LD. The insulating layer 14 may be formed on the surface of the light emitting element LD to enclose an outer circumferential surface of the active layer 12 and also to enclose areas (e.g., predetermined areas) of the first semiconductor layer 11 and the second semiconductor layer 13. Referring to FIG. 3, in some embodiments, the insulating layer 14 may expose one end of each of the first semiconductor layer 11 and the second semiconductor layer 13 that are located on the opposite ends of the light emitting element LD with respect to the longitudinal direction (L) (e.g., may expose two respective bottom surfaces, or top and bottom surfaces, of the cylinder, or may expose upper and lower surfaces of the light emitting element LD) rather than covering them.

In some embodiments, the insulating layer 14 may include one or more insulating materials selected from the group constituting of silicon oxide (SiOx), silicon nitride (SiNx), silicon oxynitride (SiOxNy), aluminum oxide (AlOx), titanium oxide (TiOx), hafnium oxide (HfOx), titanstrontium oxide (SrTiOx), cobalt oxide (CoxOy), magnesium oxide (MgO), zinc oxide (ZnO), ruthenium Oxide (RuOx), nickel oxide (NiO), tungsten oxide (WOx), tantalum oxide (TaOx), gadolinium oxide (GdOx), zirconium oxide (ZrOx), gallium oxide (GaOx), vanadium oxide (VxOy), ZnO:Al, ZnO:B, InxOy:H, niobium oxide (NbxOy), magnesium fluoride (MgFx), aluminum fluoride (AlFx), an alucone polymer film, titanium nitride (TiN), tantalum nitride (TaN), aluminum nitride (AlNx), gallium nitride (GaN), tungsten nitride (WN), hafnium nitride (HfN), niobium nitride (NbN), gadolinium nitride (GdN), zirconium nitride (ZrN), and/or vanadium nitride (VN). However, the present disclosure is not limited thereto, and various materials having insulation may be used as the material of the insulating layer 14. In other words, the material forming the insulating layer 14 is not limited to any particular material, and the insulating layer 14 may be formed of well-known various insulating materials.

The insulating layer 14 may be provided in the form of a single layer, or in the form of multiple layers including at least double layers. For example, in the case where the insulating layer 14 is formed of a double-layer structure including a first layer and a second layer that are successively stacked, the first layer and the second layer may be made of different materials (or substances), and may be formed through different processes. In some embodiments, the first layer and the second layer may be formed of identical material (or substance), and may be formed through a successive process.

If the insulating layer 14 is provided on the surface of the light emitting element LD, for example, on the surface of the active layer 12, then short-circuiting of the active layer 12 with at least one electrode (e.g., one of contact electrodes coupled to the opposite ends of the light emitting element LD), etc. may be reduced or prevented. Consequently, the electrical stability of the light emitting element LD may be secured.

Because the insulating layer 14 is formed on the surface of the light emitting element LD, occurrence of a defect on the surface of the light emitting element LD may be reduced or minimized, whereby the lifetime and efficiency of the light emitting element LD may be improved. In addition, if the insulating layer 14 is formed on each light emitting element LD, then undesirable short-circuiting of a plurality of light emitting elements LD may be reduced or prevented even when the light emitting elements LD are located adjacent to each other.

In some embodiments, the light emitting element LD may be fabricated through a surface treatment process. For example, each light emitting element LD may be surface-treated so that, when a plurality of light emitting elements LD are mixed with a fluidic solution (or solvent) and then supplied to each emission area (e.g., an emission area of each pixel), the light emitting elements LD may be evenly dispersed rather than unevenly aggregating in the solution.

In some embodiments, the light emitting element LD may further include additional other components as well as the first semiconductor layer 11, the active layer 12, the second semiconductor layer 13, and the insulating layer 14. For example, the light emitting element LD may further include at least one fluorescent layer, at least one active layer, at least one semiconductor layer and/or at least one electrode located on one end side of the first semiconductor layer 11, the active layer 12, and the second semiconductor layer 13.

Referring to FIG. 4, an electrode 15 that may be located on a sidewall of one end of the light emitting element LD may be an ohmic contact electrode or a Schottky contact electrode, but the present disclosure is not limited thereto. Furthermore, the electrode 15 may include metal or a metal oxide, and for example, Cr, Ti, Al, Au, Ni, ITO, IZO, ITZO, and/or an oxide or alloy thereof may be used alone or in combination with each other. In some embodiments, the electrode 15 may be substantially transparent or translucent. Thereby, light generated from the light emitting element LD may be emitted to the outside after passing through the electrode 15.

Hereinafter, the structure of a pixel of the display device in accordance with some embodiments will be described with reference to FIGS. 5 and 6.

Figure 5:
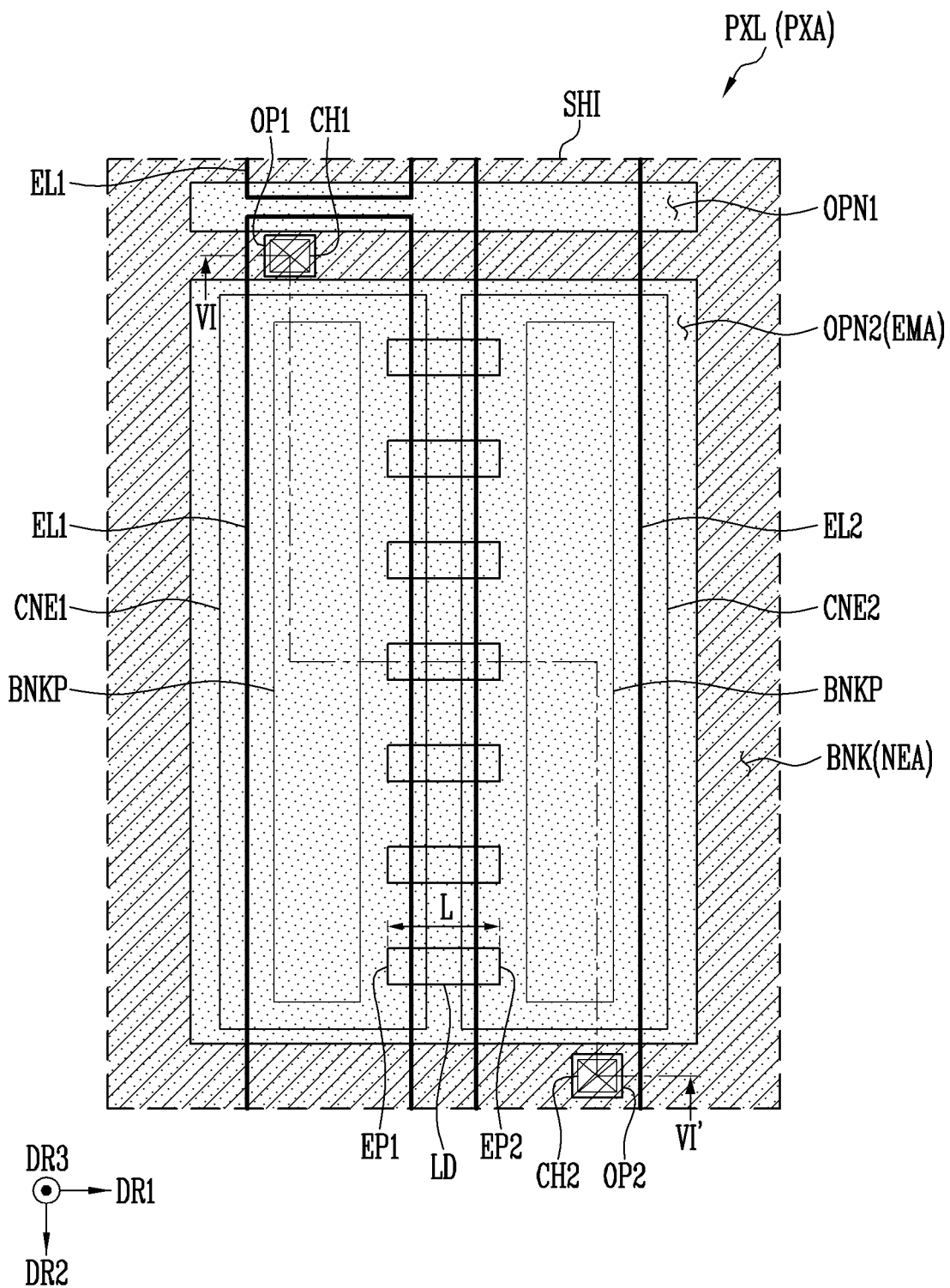
FIG. 5 is a plan view schematically illustrating dispositions of components in the pixel of the display device in accordance with some embodiments.
Figure 6:
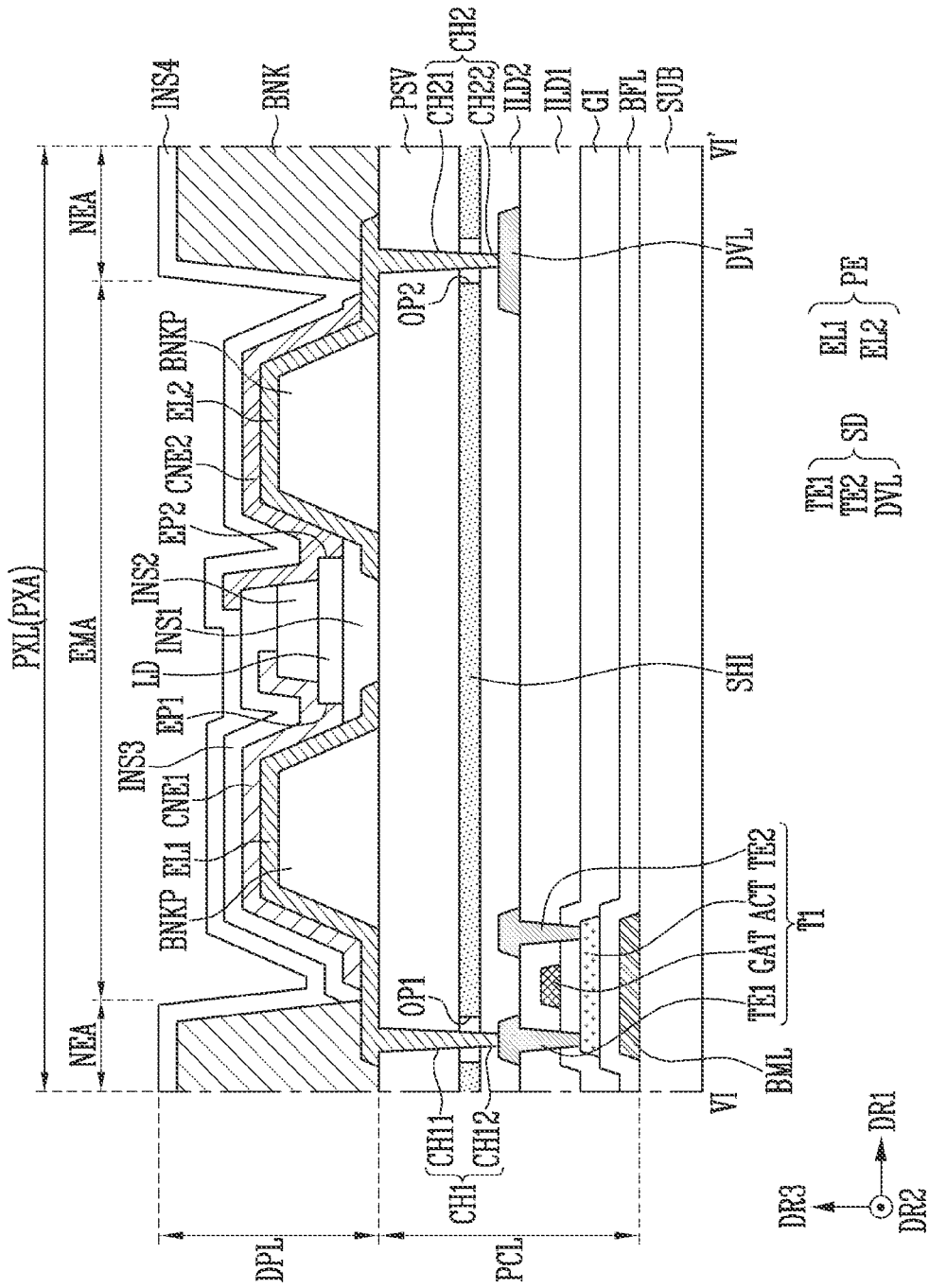
FIG. 6 is a sectional view taken along the line VI-VI' of FIG. 5.

FIG. 5 is a plan view schematically illustrating dispositions of components in the pixel of the display device in accordance with some embodiments, and FIG. 6 is a sectional view taken along the line VI-VI' of FIG. 5.

For the sake of simple explanation, in FIG. 5, some transistors electrically coupled to the light emitting elements LD and some signal lines electrically coupled to the transistors will be omitted.

Referring to FIG. 5, each pixel PXL may be formed in a pixel area PXA provided in the display area DA of the substrate SUB. The pixel area PXA may include an emission area EMA, and a non-emission area NEA formed in an area (e.g., a predetermined area) not including the emission area EMA. The non-emission area NEA may be an area that encloses the emission area EMA.

The pixel PXL may include a bank BNK, a bank pattern BNKP, a first electrode EL1, a second electrode EL2, a shielding electrode SHI, a first contact electrode CNE1, a second contact electrode CNE2, and a light emitting element LD.

The bank BNK may be located in the non-emission area NEA of the pixel area PXA. With regard to the pixel PXL illustrated in the drawing, as well as pixels PXL adjacent thereto, the bank BNK may be a structure for defining (or partitioning) the pixel areas PXA and/or the emission areas EMA of the respect pixels PXL. In some embodiments, during a process of supplying light emitting elements to each pixel PXL, the bank BNK may be a pixel defining layer or a dam structure for defining an area to which the light emitting elements LD are to be supplied. For example, because the emission area EMA of each pixel PXL is defined by the bank BNK, a mixed solution (e.g., ink) including a target amount and/or type of light emitting elements LD may be supplied (or input) to the emission area EMA.

The bank BNK may include at least one opening that exposes components located under the bank BNK in the pixel area PXA. For example, the bank BNK may include a first opening OPN1 and a second opening OPN2 that expose components located under the bank BNK. The first opening OPN1 of the bank BNK may be located adjacent to an upper side of the pixel area PXA. The second opening OPN2 of the bank BNK may correspond to the emission area EMA of the pixel PXL. The shown pixel PXL, and an end of a first electrode EL1 of a pixel PXL that is adjacent to the shown pixel PXL in the second direction DR2, may be located in the first opening OPN1. In the second opening OPN2, the bank pattern BNKP, the light emitting elements LD, the first contact electrode CNE1, and the second contact electrode CNE2 may be located, and a portion of the first electrode EL1 and a portion of the second electrode EL2 may also be located.

The bank pattern BNKP is located in the emission area EMA. The bank pattern BNKP may be a support that supports the first electrode EL1 and the second electrode EL2 to thereby change surface profiles (or shapes) of the first electrode EL1 and the second electrode EL2, as will be described below, so that light emitted from the light emitting elements LD may be guided in an image display direction (e.g., in the third direction DR3) of the display device.

The first electrode EL1 may extend in the second direction DR2. Here, the first electrode EL1 of the shown pixel PXL may be separated from the first electrode EL1 included in the adjacent pixel PXL that is adjacent to the shown pixel in the second direction DR2 and that is located in the first opening OPN1. In other words, after the light emitting elements LD are supplied and aligned in the pixel area PXA, a separation process for the first electrodes EL1 at a region in the first opening OPN1 of the bank BNK may be performed.

The second electrode EL2 may be spaced apart from the first electrode EL1 in the first direction DR1. The second electrode EL2 may extend in the second direction DR2. The second electrode EL2 of the shown pixel PXL may extend from a second electrode EL2 included in the adjacent pixel PXL that is adjacent to the shown pixel PXL in the second direction DR2.

The first electrode EL1 and the second electrode EL2 may be used as alignment electrodes in such a way that alignment voltages are applied thereto after a mixed solution (e.g., ink) including light emitting elements LD is input to the emission area EMA. The first electrode EL1 may be a first alignment electrode, and the second electrode EL2 may be a second alignment electrode. Here, the light emitting elements LD may be aligned in a desired direction and/or at desired positions by an electric field formed between the first alignment electrode and the second alignment electrode. Furthermore, the first electrode EL1 and the second electrode EL2 may function as driving electrodes for driving the light emitting elements LD after the light emitting elements LD have been aligned.

The first electrode EL1 may be an anode of the emission unit EMU described with reference to FIG. 2. Hence, the first electrode EL1 may be physically and/or electrically coupled, through a first contact hole CH1, with the first transistor T1 described with reference to FIG. 2.

The second electrode EL2 may be a cathode of the emission unit EMU described with reference to FIG. 2. Hence, the second electrode EL2 may be physically and/or electrically coupled, through a second contact hole CH2, with the second power line PL2 (or the second driving power supply VSS) described with reference to FIG. 2.

The shielding electrode SHI may define a first contact opening OP1 and a second contact opening OP2. The shielding electrode SHI, other than the first contact opening OP1 and the second contact opening OP2, may be located on the entireties of the emission area EMA and the non-emission area NEA.

The first contact opening OP1 may be an area enclosing the first contact hole CH1. The first electrode EL1 may be physically and/or electrically coupled with a drain electrode TE1 of the first transistor T1, which will be described below, through the first contact hole CH1 of the first contact opening OP1.

The second contact opening OP2 may be an area adjacent the second contact hole CH2. The second electrode EL2 may be physically and/or electrically coupled with the second power line PL2 (or a driving voltage line DVL), which will be described below, through the second contact hole CH2 of the second contact opening OP2.

The shielding electrode SHI may block an electric field (or an electric field effect) that may be formed between one or both of the drain electrode TE1 of the first transistor T1 and the driving voltage line DVL and one or more of the first electrode EL1 (or the first contact electrode CNE1) and the second electrode EL2 (or the second contact electrode CNE2), which will be described below. The effect of the shielding electrode SHI will be described in detail below.

The first contact electrode CNE1 may be located to overlap with the first end EP1 of each of the light emitting elements LD and the first electrode EL1. Hence, the first contact electrode CNE1 may electrically and/or physically couple the first end EP1 of the light emitting element LD with the first electrode EL1.

The second contact electrode CNE2 may be located to overlap with the second end EP2 of each of the light emitting elements LD and the second electrode EL2. Hence, the second contact electrode CNE2 may electrically and/or physically couple the second end EP2 of the light emitting element LD with the second electrode EL2.

In a plan view, the first contact electrode CNE1 and the second contact electrode CNE2 may each have a bar shape extending in the second direction DR2, but the present disclosure is not limited thereto. In some embodiments, the shape of each of the first contact electrode CNE1 and the second contact electrode CNE2 may be changed in various ways within a range in which the first and second contact electrodes CNE1 and CNE2 may be reliably electrically coupled with each of the light emitting elements LD. The shape of each of the first contact electrode CNE1 and the second contact electrode CNE2 may be changed in various ways while considering respective connection relationships with the first electrode EL1 and the second electrode EL2 that are located thereunder.

Each of the light emitting elements LD may be located between the first electrode EL1 and the second electrode EL2 such that the longitudinal direction (L) thereof is substantially parallel to the first direction DR1.

The first end EP1 (or one end) of the light emitting element LD may overlap with the first electrode EL1 and the first contact electrode CNE1. The first end EP1 of the light emitting element LD may be physically and/or electrically coupled with the first electrode EL1 and the first contact electrode CNE1.

The second end EP2 (or the other end) of the light emitting element LD may overlap with the second electrode EL2 and the second contact electrode CNE2. The second end EP2 of the light emitting element LD may be physically and/or electrically coupled with the second electrode EL2 and the second contact electrode CNE2.

Referring to FIG. 6, the display device may include a substrate SUB, a pixel circuit layer PCL, and a display element layer DPL.

The substrate SUB may be a rigid substrate or a flexible substrate, and a substrate including transparent insulating material to allow light to transmit therethrough.

The pixel circuit layer PCL may include a bottom metal layer BML, a buffer layer BFL, a first transistor T1, a data conductor SD, one or more insulating layers GI, ILD1, and ILD2, a shielding electrode SHI, and a passivation layer PSV.

The bottom metal layer BML may be located between the substrate SUB and the buffer layer BFL. The bottom metal layer BML may be included in the first transistor T1 to be described below. The bottom metal layer BML and a gate electrode GAT of the first transistor T1 may overlap with each other with the buffer layer BFL interposed therebetween. The bottom metal layer BML may be located under a semiconductor layer ACT of the first transistor T1. Here, the bottom metal layer BML may function as a light shielding pattern to stabilize operation characteristics of the first transistor T1.

In some embodiments, the first transistor T1 may omit the bottom metal layer BML. In this case, the buffer layer BFL may be located directly on the base layer BSL. Furthermore, the bottom metal layer BML may be physically and/or electrically coupled with the drain electrode TE1 of the first transistor T1, which will be described below, through a contact hole of an insulating layer. Hence, the threshold voltage of the first transistor T1 may be shifted in a negative direction or a positive direction.

The buffer layer BFL may cover the substrate SUB and the bottom metal layer BML, and may be located on the substrate SUB.

The buffer layer BFL may reduce or prevent impurities from diffusing into the pixel circuit layer PCL. The buffer layer BFL may be an inorganic insulating layer formed of inorganic material. For example, the buffer layer BFL may include at least one of silicon nitride SiNx, silicon oxide SiOx, silicon oxynitride SiOxNy, and/or aluminum oxide AlOx. The buffer layer BFL may be omitted depending on the material of the substrate SUB or processing conditions.

The first transistor T1 may include a semiconductor layer ACT, a gate electrode GAT, a drain electrode TE1, and a source electrode TE2. In some embodiments, the drain electrode TE1 and the source electrode TE2 may be switched with each other.

The semiconductor layer ACT may be located on the buffer layer BFL. The semiconductor layer ACT may include a drain area coupled to the drain electrode TE1, a source area coupled to the source electrode TE2, and a channel area between the drain area and the source area. The channel area may overlap with the gate electrode GAT of the first transistor T1. The semiconductor layer ACT may be a semiconductor pattern formed of poly silicon, amorphous silicon, an oxide semiconductor, etc.

The gate insulating layer GI may be located on the semiconductor layer ACT to cover the semiconductor layer ACT and the buffer layer BFL. The gate insulating layer GI may be an inorganic insulating layer including inorganic material. For example, the gate insulating layer GI may include at least one of metal oxides such as silicon nitride (SiNx), silicon oxide (SiOx), silicon oxynitride (SiOxNy), and/or aluminum oxide (AlOx). In some embodiments, the gate insulating layer GI may be formed of an organic insulating layer including organic material. The gate insulating layer GI may be provided in a single-layer structure, or may also be provided in a multilayer structure having two or more layers.

The gate electrode GAT may be located on the gate insulating layer GI to overlap with the channel area of the semiconductor layer ACT. The gate electrode GAT may have a single-layer structure formed of one or combination selected from the group consisting of copper (Cu), molybdenum (Mo), tungsten (W), aluminum neodymium (AlNd), titanium (Ti), aluminum (Al), silver (Ag), and/or an alloy thereof. Furthermore, the gate electrode GAT may have a double-layer or multi-layer structure formed of molybdenum (Mo), titanium (Ti), copper (Cu), aluminum (Al), or silver (Ag), which are generally low-resistance materials.

A first interlayer insulating layer ILD1 may be located on the gate electrode GAT to cover the gate electrode GAT and the gate insulating layer GI. The first interlayer insulating layer ILD1 may include the same material as that of the gate insulating layer GI, or may include one or more materials selected from among materials that may be used for forming the gate insulating layer GI.

The first interlayer insulating layer ILD1 may include contact holes to be used to couple the drain electrode TE1 of the first transistor T1 and the source electrode TE2 of the first transistor T1 to the drain area and the source area of the semiconductor layer ACT, respectively.

The data conductor SD that includes the drain electrode TE1 of the first transistor T1, the source electrode TE1 of the first transistor T1, and the driving voltage line DVL may be located on the first interlayer insulating layer ILD1.

The drain electrode TE1 and the source electrode TE2 may be respectively coupled to the source area and the drain area of the semiconductor layer ACT through respective contact holes that successively pass through the gate insulating layer GI and the first interlayer insulating layer ILD1.

The driving voltage line DVL may have the same configuration as that of the second power line PL2 described with reference to FIG. 2. Hence, the voltage of the second power supply VSS may be applied to the driving voltage line DVL. In other embodiments, the pixel circuit layer PCL may further include a first power line coupled to the first driving power supply. The first power line PL1 may be electrically coupled with a component of the display element layer DPL (e.g., with the first electrode EL1 of the display element layer DPL). The driving voltage line DVL may be electrically coupled with another component of the display element layer DPL (e.g., with the second electrode EL2 of the display element layer DPL).

Although it has been described that the driving voltage line DVL is located on the same layer as that of the drain electrode TE1 and the source electrode TE2 of the first transistor T1, the present disclosure is not limited thereto. In some embodiments, the driving voltage line DVL may be located on the same layer as that of any one of the conductive layers provided on the pixel circuit layer PCL.

The second interlayer insulating layer ILD2 may be located on the first interlayer insulating layer ILD1 to cover the first interlayer insulating layer ILD1 and the data conductor SD. The second interlayer insulating layer ILD2 may be an inorganic insulating layer including inorganic material or an organic insulating layer including organic material. In some embodiments, the second interlayer insulating layer ILD2 may include the same material as that of the first interlayer insulating layer ILD1, but the present disclosure is not limited thereto. Although the second interlayer insulating layer ILD2 may be provided in a single-layer structure, the second interlayer insulating layer ILD2 also may be provided in a multi-layer structure having two or more layers.

The second interlayer insulating layer ILD2 may include a 1-2-th contact hole CH12 that exposes the drain electrode TE1 of the first transistor T1, and a 2-2-th contact hole CH22 that exposes the driving voltage line DVL. The 1-2-th contact hole CH12, along with a 1-1-th contact hole CH11 to be described below, may form the first contact hole CH1. The drain electrode TE1 of the first transistor T1 may be physically and/or electrically coupled with the first electrode EL1 through the first contact hole CH1. The 2-2-th contact hole CH22 along with 2-1-th contact hole CH21 to be described below may form the second contact hole CH2. The driving voltage line DVL may be physically and/or electrically coupled with the second electrode EL2 through the second contact hole CH2.

The shielding electrode SHI may be located on the second interlayer insulating layer ILD2. The shielding electrode SHI may include a first contact opening OP1 and a second contact opening OP2.

The first contact opening OP1 may expose a portion of an upper surface of the drain electrode TE1 of the first transistor T1. In the first contact opening OP1, the drain electrode TE1 of the first transistor T1 may be physically and/or electrically coupled with the first electrode EL1 through the first contact hole CH1.

The first contact opening OP1 may have a width that is greater than that of a portion of the first contact hole CH1 so that the first contact opening OP1 may be appropriately spaced, in the first direction DR1 and the second direction DR2, apart from the first electrode EL1 extending into the first contact hole CH1. Hence, even when a pixel electrode layer PE (e.g., the first and second electrodes EL1 and EL2) and the data conductor SD are coupled through the first contact hole CH1, the pixel electrode layer PE extending into the first contact hole CH1 may be spaced apart from the shielding electrode SHI to reduce or prevent the likelihood of the shielding electrode SHI and the pixel electrode layer PE undesirably short-circuiting.

The second contact opening OP2 may expose a portion of an upper surface of the driving voltage line DVL. In the second contact opening OP2, the driving voltage line DVL may be physically and/or electrically coupled with the second electrode EL2 through the second contact hole CH2.

The second contact opening OP2 may have a width that is greater than that of a portion of the second contact hole CH2 so that the second contact opening OP2 may be appropriately spaced, in the first direction DR1 and the second direction DR2, apart from the second electrode EL2 extending into the second contact hole CH2. Hence, even when the pixel electrode layer PE and the data conductor SD are coupled through the second contact hole CH2, the pixel electrode layer PE extending into the second contact hole CH2 may be spaced apart from the shielding electrode SHI, so that a likelihood of the shielding electrode SHI and the pixel electrode layer PE may be prevented from undesirably short-circuiting may be reduced or prevented.

The shielding electrode SHI may float. The shielding electrode SHI may be located in an overall area between the data conductor SD and the pixel electrode layer PE, excluding an area (e.g., the first contact opening OP1 and the second contact opening OP2) in which, for example, the data conductor SD is coupled with the pixel electrode layer PE, as to be described below. Hence, the occurrence of crosstalk, a difference in electric field, etc. may be reduced or prevented due to a capacitance formed between the data conductor SD and the pixel electrode layer PE when alignment signals (or signals) are applied to the first electrode EL1 and the second electrode EL2.

The shielding electrode SHI may include transparent metal material. For example, the shielding electrode SHI may include material such as indium tin oxide (ITO), indium zinc oxide (IZO), zinc oxide (ZnO), indium gallium zinc oxide (IGZO), aluminum doped zinc oxide (AZO), gallium doped zinc oxide (GZO), or zinc tin oxide (ZTO). However, the present disclosure is not limited thereto, and the shielding electrode SHI may include a conductive polymer such as PEDOT (poly(3,4-ethylenedioxythiophene)), or other conductive materials including carbon nanotubes or graphene. Furthermore, the shielding electrode SHI may include at least one of various metal materials including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof.

Although it has been described that the shielding electrode SHI, other than the first contact opening OP1 and the second contact opening OP2, is located on the entireties of the emission area EMA and the non-emission area NEA, the present disclosure is not limited thereto. In some embodiments, the position of the shielding electrode SHI may be changed in various ways within a range in which capacitance may be reduced or prevented from occurring between the data conductor SD and the pixel electrode layer PE. For example, the shielding electrode SHI may be located only in the emission area EMA.

The passivation layer PSV may be located on the shielding electrode SHI to cover the shielding electrode SHI. A lower surface of the passivation layer PSV may be spaced apart from an upper surface of the second interlayer insulating layer ILD2 in the first contact opening OP1 and the second contact opening OP2 of the shielding electrode SHI.

The passivation layer PSV may include an inorganic insulating layer and/or an organic insulating layer. The inorganic insulating layer may include at least one of metal oxides, such as silicon oxide (SiOx), silicon nitride (SiNx), silicon oxynitride (SiOxNy), and/or aluminum oxide (AlOx). The organic insulating layer may include at least one of polyacrylates resin, epoxy resin, phenolic resin, polyamides resin, polyimides rein, unsaturated polyesters resin, poly-phenylen ethers resin, poly-phenylene sulfides resin, and/or benzocyclobutene resin.

The passivation layer PSV may include a 1-1-th contact hole CH11 that exposes the drain electrode TE1 of the first transistor T1, and a 2-1-th contact hole CH21 that exposes the driving voltage line DVL. The 1-1-th contact hole CH11 along with the 1-2-th contact hole CH12 described above may form the first contact hole CH1. The drain electrode TE1 of the first transistor T1 may be physically and/or electrically coupled with the first electrode EL1 through the first contact hole CH1. The 2-1-th contact hole CH21 along with 2-2-th contact hole CH22 described above may form the second contact hole CH2. The driving voltage line DVL may be physically and/or electrically coupled with the second electrode EL2 through the second contact hole CH2.

The display element layer DPL may be located on the passivation layer PSV. The display element layer DPL may include a bank pattern BNKP, a pixel electrode layer PE, a bank BNK, a light emitting element LD, a first contact electrode CNE1, a second contact electrode CNE2, and a plurality of insulating layers INS1, INS2, INS3, and INS4.

The bank pattern BNKP may be located on the passivation layer PSV. The bank pattern BNKP may have a trapezoidal cross-section that is reduced in width from one surface (e.g., an upper surface) of the passivation layer PSV in an upward direction/in the third direction DR3. In some embodiments, the bank pattern BNKP may include a curved surface having a cross-sectional shape, such as a semi-elliptical shape or a semi-circular shape (or a hemispherical shape), which is reduced in width from one surface of the passivation layer PSV upward in the third direction DR3. In a sectional view, the shape of the bank pattern BNKP is not limited to the foregoing examples, and may be changed in various ways within a range in which the efficiency of light emitted from each of the light emitting elements LD may be enhanced.

The bank pattern BNKP may be an inorganic insulating layer including inorganic material, or an organic insulating layer including organic material. In some embodiments, the bank pattern BNKP may include an organic insulating layer having a single-layer structure and/or an inorganic insulating layer having a single-layer structure, but the present disclosure is not limited thereto. In some embodiments, the bank pattern BNKP may be omitted.

The pixel electrode layer PE including the first electrode EL1 and the second electrode EL2 may be located on the passivation layer PSV and the bank pattern BNKP.

The first electrode EL1 and the second electrode EL2 may be located on the bank pattern BNKP. In a sectional view, the first electrode EL1 and the second electrode EL2 each may have a surface profile corresponding to the shape of the bank pattern BNKP. In some embodiments, in the case where the bank pattern BNKP is omitted, the first electrode EL1 and the second electrode EL2 may be located on the upper surface of the passivation layer PSV.

The first electrode EL1 and the second electrode EL2 each may be formed of material having a reflectivity (e.g., a predetermined reflectivity) to enable light emitted from the light emitting element LD to travel in an image display direction (e.g., in the third direction DR3) of the display device. For example, the first electrode EL1 and the second electrode EL2 each may be formed of a single layer including conductive oxide such as indium tin oxide (ITO), indium zinc oxide (IZO), zinc oxide (ZnO), indium gallium zinc oxide (IGZO), or indium tin zinc oxide (ITZO), and/or a conductive polymer such as PEDOT (poly(3,4-ethylenedioxythiophene)). Furthermore, the first electrode EL1 and the second electrode EL2 each may be formed of a multi-layer that further includes metal such as silver (Ag), magnesium (Mg), aluminum (Al), platinum (Pt), palladium (Pd), gold (Au), nickel (Ni), neodymium (Nd), iridium (Ir), chrome (Cr), titanium (Ti), or an alloy thereof.

The first electrode EL1 may be physically and/or electrically coupled with the drain electrode TE1 of the first transistor T1 through the first contact hole CH1. The second electrode EL2 may be physically and/or electrically coupled with the driving voltage line DVL through the second contact hole CH2.

The first electrode EL1 and the second electrode EL2 may be provided in shapes that are different from that of the data conductor SD. The first electrode EL1 and the second electrode EL2 may be provided at positions that are different from that of the data conductor SD. Hence, if a voltage is applied to the data conductor SD while a voltage is applied to the pixel electrode PE, a capacitance may occur between the data conductor SD and the pixel electrode layer PE, and a difference in electric field between areas may be caused.

In some embodiments, because the shielding electrode SHI that floats is located between the pixel electrode layer PE and the data conductor SD, capacitance and an electric field difference occurring between the data conductor SD and the pixel electrode layer PE may be reduced or prevented. Therefore, in some embodiments, the light emitting elements LD may be aligned in a desired way when the light emitting elements LD are aligned by applying an alignment voltage (or a signal) to the pixel electrode layer PE.

The first insulating layer INS1 may be located on the passivation layer PSV to at least partially cover the first electrode EL1, the second electrode EL2, and the passivation layer PSV. The first insulating layer INS1 may be located between the first electrode EL1 and the second electrode EL2 so that the first electrode EL1 and the second electrode EL2 may be electrically insulated from each other (e.g., prevented from short-circuiting with each other). The first insulating layer INS1 may be formed of an inorganic insulating layer including inorganic material, or an organic insulating layer including organic material. For example, the first insulating layer INS1 may include at least one of metal oxides such as silicon nitride SiNx, silicon oxide SiOx, silicon oxynitride SiOxNy, and/or aluminum oxide AlOx, but the present disclosure is not limited thereto. The first insulating layer INS1 may be formed of an inorganic insulating layer or an organic insulating layer having an advantage in protecting the light emitting elements LD from the pixel circuit layer PCL.

The light emitting element LD may be located on the first insulating layer INS1. The first end EP1 of the light emitting element LD may be located to face the first electrode EL1.

The second end EP2 of the light emitting element LD may be located to face the second electrode EL2. The first end EP1 of the light emitting element LD may at least partially overlap with the first electrode EL1 in the third direction DR3. The second end EP2 of the light emitting element LD may at least partially overlap with the second electrode EL2 in the third direction DR3

The bank BNK may be located on the passivation layer PSV. The bank BNK may be located to at least partially overlap with the first electrode EL1 and the second electrode EL2. At the operation of supplying the light emitting elements LD to the emission area EMA, the bank BNK may be a dam structure configured to reduce or prevent the likelihood of a solution including the light emitting elements LD being drawn into the emission area EMA of an adjacent pixel PXL, or configured to control the amount of solution such that a constant amount of solution is supplied to each emission area EMA. The bank BNK may include light shielding material and/or reflective material, thus reducing or preventing a light leakage defect in which light (or rays) leaks between each pixel PXL and the pixels PXL adjacent thereto. In some embodiments, the bank BNK may include transparent material. For example, the bank BNK may include polyamides resin, polyimides resin, etc., but the present disclosure is not limited thereto. In some embodiments, to enhance the efficiency of light emitted from the pixel PXL, a separate reflective material layer may be provided and/or formed on the bank BNK.

Although the bank BNK has been described as being located on the passivation layer PSV, the present disclosure is not limited thereto. In some embodiments, in the case where the first insulating layer INS1 is located in the non-emission area NEA, the bank BNK may be located on the first insulating layer INS1 and located to at least partially overlap with the first electrode EL1 and the second electrode EL2.

The second insulating layer INS2 may be located on each of the light emitting elements LD. The second insulating layer INS2 may be located on a portion of the upper surface of the light emitting element LD such that the first end EP1 and the second end EP2 of the light emitting element LD are exposed. The second insulating layer INS2 may be formed of an organic insulating layer including organic material, depending on design conditions, etc. of the display device including the light emitting elements LD. After the arrangement of the light emitting elements LD in the pixel area PXA has been completed, the second insulating layer INS2 is located on the light emitting elements LD so that the light emitting elements LD may be fixed in place (e.g., prevented from being removed from the aligned positions).

In the case where a gap (or space) is present between the first insulating layer INS1 and the light emitting element LD before the formation of the second insulating layer INS2, the gap may be filled with the second insulating layer INS2 during a process of forming the second insulating layer INS2. In this case, the second insulating layer INS2 may be formed of an organic insulating layer that has an advantage in filling the gap between the first insulating layer INS1 and the light emitting elements LD with the second insulating layer INS2.

The second insulating layer INS2 may be formed of a single layer or a multi-layer, and may include an inorganic insulating layer including at least one inorganic material or an organic insulating layer including at least one organic material. For example, the second insulating layer INS2 may include at least one of metal oxides, such as silicon nitride SiNx, silicon oxide SiOx, silicon oxynitride SiOxNy, and/or aluminum oxide AlOx, but the present disclosure is not limited thereto.

The first contact electrode CNE1 may be located on the first electrode EL1 to cover the first electrode EL1, and may be located to at least partially overlap with the first insulating layer INS1, the light emitting element LD, and the second insulating layer INS2. The first contact electrode CNE1 may come into direct contact with the first end EP1 of the light emitting element LD and the first electrode EL1, and may physically and/or electrically reliably couple the first end EP1 of the light emitting element LD to the first electrode EL1. The first contact electrode CNE1 may include transparent conductive material, such as indium tin oxide (ITO), indium zinc oxide (IZO), zinc oxide (ZnO), and/or indium gallium zinc oxide (IGZO).

The third insulating layer INS3 may be located on the second insulating layer INS2 and the first contact electrode CNE1 to cover the second insulating layer INS2 and the first contact electrode CNE1. The third insulating layer INS3 may be located such that a perimeter thereof comes into contact with one end of the second insulating layer INS2 so that the second end EP2 of the light emitting element LD is exposed. The third insulating layer INS3 may be an inorganic insulating layer including inorganic material, or an organic insulating layer including organic material. For example, the third insulating layer INS3 may include at least one of metal oxides such as silicon nitride SiNx, silicon oxide SiOx, silicon oxynitride SiOxNy, and/or aluminum oxide AlOx, but the present disclosure is not limited thereto.

The second contact electrode CNE2 may be located on the second electrode EL2 to cover the second electrode EL2, and may be located to at least partially overlap with the first insulating layer INS1, the light emitting element LD, and the third insulating layer INS3. The second contact electrode CNE2 may come into direct contact with the second end EP2 of the light emitting element LD and the second electrode EL2, and may physically and/or electrically reliably couple the second end EP2 of the light emitting element LD to the second electrode EL2. The second contact electrode CNE2 may include transparent conductive material such as indium tin oxide (ITO), indium zinc oxide (IZO), zinc oxide (ZnO), and/or indium gallium zinc oxide (IGZO).

The fourth insulating layer INS4 may be located on the third insulating layer INS3, the second contact electrode CNE2, and the bank BNK to cover the third insulating layer INS3, the second contact electrode CNE2, and the bank BNK. The fourth insulating layer INS4 may be an inorganic insulating layer including inorganic material, or an organic insulating layer including organic material. For example, the fourth insulating layer INS4 may have a structure formed by alternately stacking at least one inorganic insulating layer and at least one organic insulating layer. The fourth insulating layer INS4 may cover the entirety of the display element layer DPL, and may reduce or prevent the likelihood of water or moisture being drawn from the outside into the display element layer DPL including the light emitting elements LD.

Although it has been described that the first contact electrode CNE1 and the second contact electrode CNE2 are located on different layers with the third insulating layer INS3 interposed therebetween, the present disclosure is not limited thereto. In some embodiments, the first contact electrode CNE1 and the second contact electrode CNE2 may be formed through an identical process and located on an identical layer (e.g., the second insulating layer INS2).

In some embodiments, the display element layer DPL may selectively further include an optical layer, as well as including the fourth insulating layer INS4. For example, the display element layer DPL may further include a color conversion layer including color conversion particles for converting the color of light emitted from the light emitting elements LD to a specific color of light.

In some embodiments, at least one overcoat layer (e.g., a layer for planarizing an upper surface of the display element layer DPL) may be further located over the fourth insulating layer INS4.

Hereinafter, a method of manufacturing the display device in accordance with the embodiments of FIG. 6 will be described with reference to FIGS. 7 to 12.

FIGS. 7 to 12 are sectional views schematically illustrating a method of manufacturing the display device in accordance with some embodiments.

Figure 7:
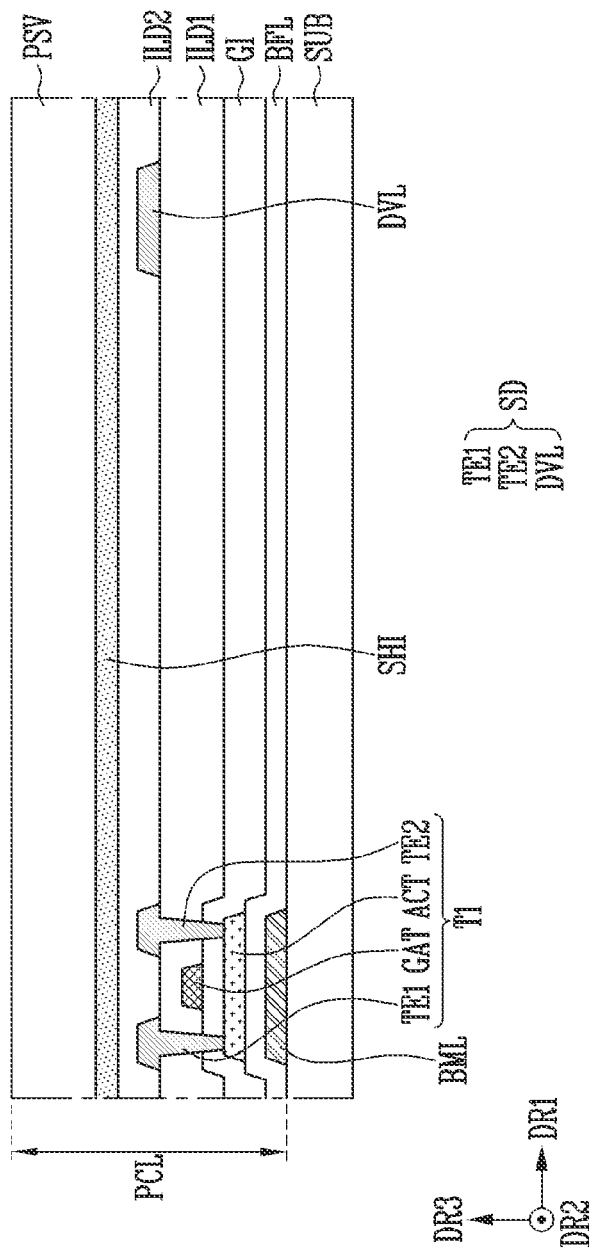
FIGS. 7 to 12 are sectional views schematically illustrating a method of manufacturing the display device in accordance with some embodiments.

Referring to FIG. 7, the bottom metal layer BML, the buffer layer BFL, the semiconductor layer ACT, the gate insulating layer GI, the gate electrode GAT, the first interlayer insulating layer ILD1, the data conductor SD, and the second interlayer insulating layer ILD2 are successively formed on the substrate SUB.

The shielding electrode SHI is formed on the upper surface of the second interlayer insulating layer ILD2. The passivation layer PSV is formed on the upper surface of the shielding electrode SHI.

The second interlayer insulating layer ILD2 may be formed to generally cover the upper surfaces of the data conductor SD and the first interlayer insulating layer ILD1. Furthermore, the shielding electrode SHI may be formed to generally cover the upper surface of the second interlayer insulating layer ILD2. The passivation layer PSV may be formed to generally cover the upper surface of the shielding electrode SHI.

The second interlayer insulating layer ILD2 may be formed to include inorganic material (or substance) or organic material (or substance). For example, the shielding electrode SHI may be formed of transparent metal material, such as indium tin oxide (ITO), indium zinc oxide (IZO), zinc oxide (ZnO), indium gallium zinc oxide (IGZO), aluminum doped zinc oxide (AZO), gallium doped zinc oxide (GZO), or zinc tin oxide (ZTO). The present disclosure is not limited thereto, and the shielding electrode SHI may include a conductive polymer such as PEDOT (poly(3,4-ethylenedioxythiophene)), or other conductive materials including carbon nanotubes or graphene. Furthermore, the shielding electrode SHI may include at least one of various metal materials including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof.

The passivation layer PSV may include organic material (or substance) including at least one of polyacrylates resin, epoxy resin, phenolic resin, polyamides resin, polyimides rein, unsaturated polyesters resin, poly-phenylen ethers resin, poly-phenylene sulfides resin, and benzocyclobutene resin.

Figure 8:
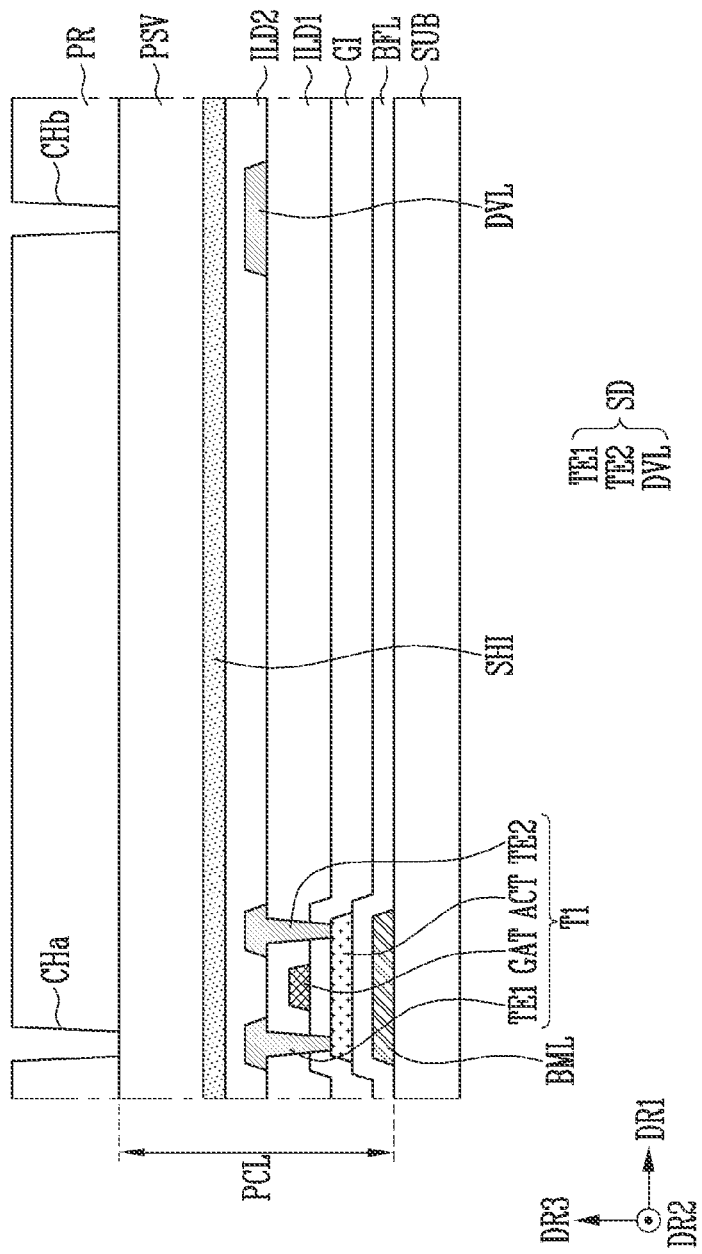

Referring to FIG. 8, a photoresist PR is applied to the entirety of the upper surface of the passivation PSV. A first opening pattern CHa and a second opening pattern CHb may be formed by etching portions of the photoresist PR.

The first opening pattern CHa of the photoresist PR may correspond to a position at which the first contact hole CH1 (or the first contact opening OP1) is to be formed. The second opening pattern CHb of the photoresist PR may correspond to a position at which the second contact hole CH2 (or the second contact opening OP2) is to be formed.

Figure 9:
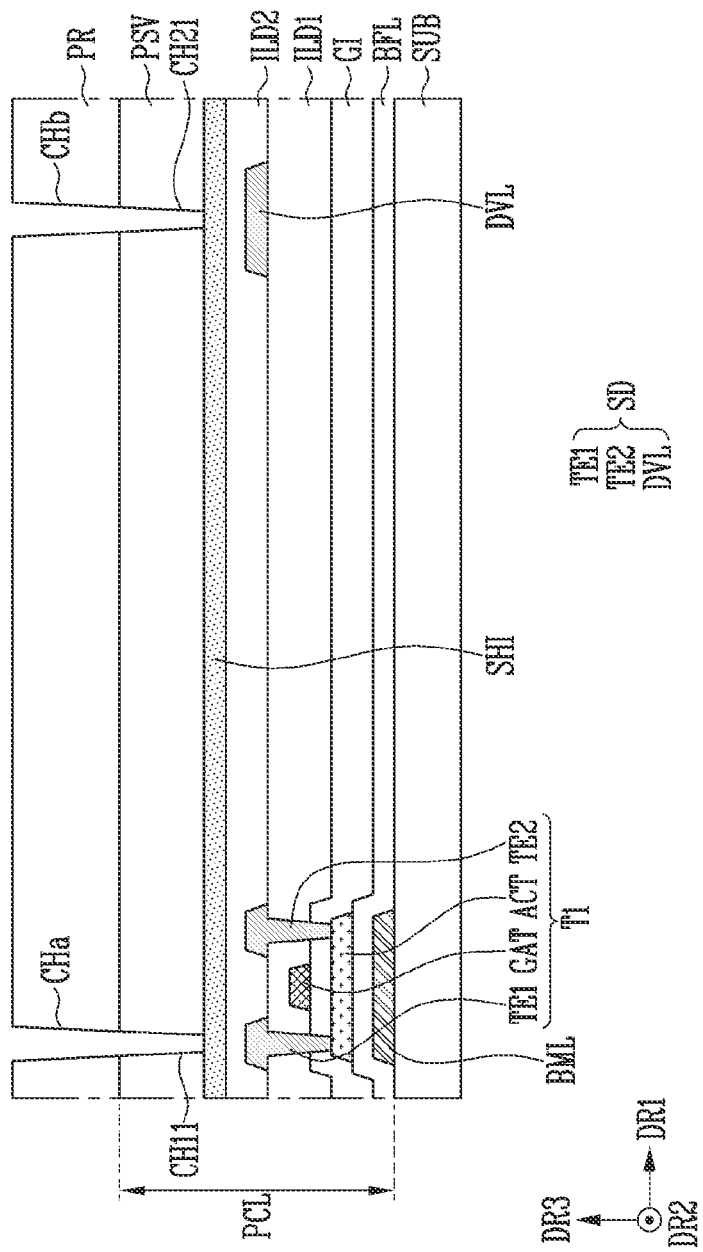

Referring to FIG. 9, the 1-1-th contact hole CH11 and the 2-1-th contact hole CH21 are formed by partially etching the passivation layer PSV. The 1-1-th contact hole CH11 and the 2-1-th contact hole CH21 of the passivation layer PSV may be formed through a dry etching process.

The 1-1-th contact hole CH11 may extend from the first opening pattern CHa of the photo resist PR. The 2-1-th contact hole CH21 may extend from the second opening pattern CHb of the photo resist PR. The 1-1-th contact hole CH11 may correspond to the position at which the first contact opening OP1 is to be formed. The 2-1-th contact hole CH21 may correspond to the position at which the second contact opening OP2 is to be formed.

Figure 10:
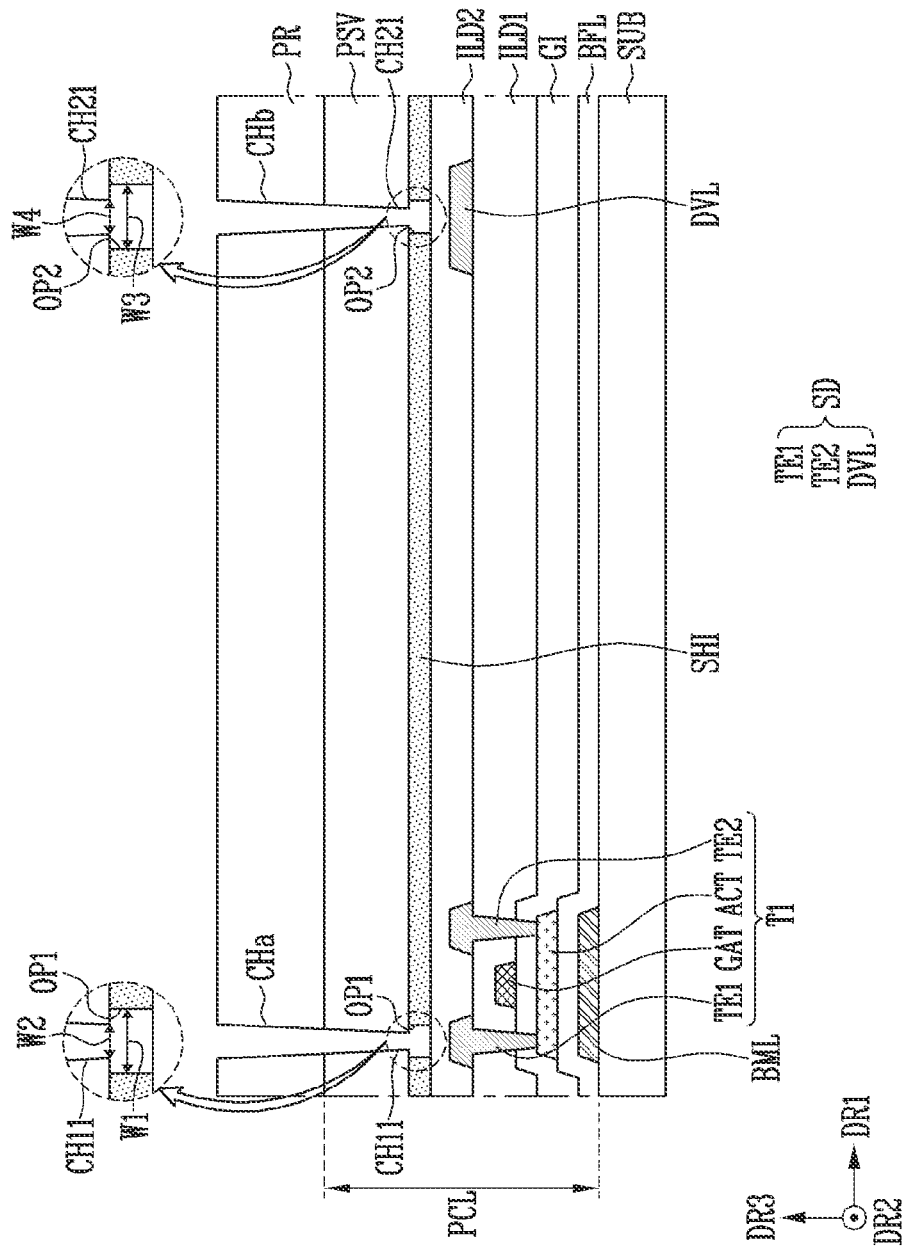

Referring to FIG. 10, the first contact opening OP1 and the second contact opening OP2 are formed by partially etching the shielding electrode SHI. The first contact opening OP1 and the second contact opening OP2 of the shielding electrode SHI may be formed through a wet etching process.

In forming the first contact opening OP1 and the second contact opening OP2 of the shielding electrode SHI, an undercut structure may be formed in each of the first contact opening OP1 and the second contact opening OP2 by over-etching the shielding electrode SHI by increasing an etching time. In other words, a width W1 of the first contact opening OP1 may be greater than a width W2 of a lower end of the 1-1-th contact hole CH11. A width W3 of the second contact opening OP2 may be greater than a width W4 of a lower end of the 2-1-th contact hole CH21.

Hence, even when the pixel electrode layer PE and the data conductor SD are coupled through the first contact hole CH1 and the second contact hole CH2, the pixel electrode layer PE extending into the first contact hole CH1 and the second contact hole CH2 may be spaced apart from the shielding electrode SHI, so that the shielding electrode SHI and the pixel electrode layer PE may be prevented from undesirably short-circuiting.

Figure 11:
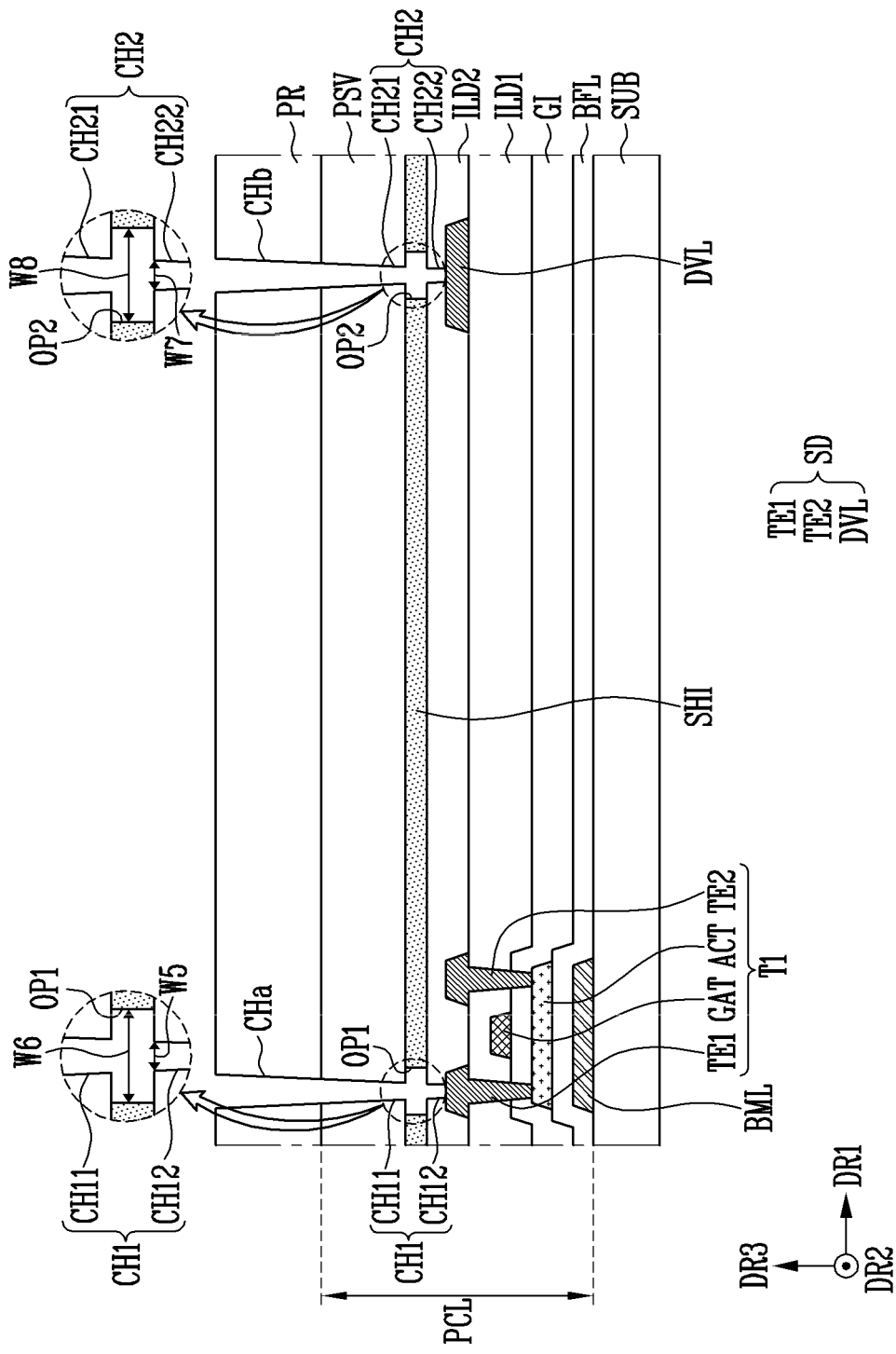

Referring to FIG. 11, the 1-2-th contact hole CH12 and the 2-2-th contact hole CH22 are formed by partially etching the second interlayer insulating layer ILD2. The 1-2-th contact hole CH12 and the 2-2-th contact hole CH22 of the second interlayer insulating layer ILD2 may be formed through a dry etching process. The upper surface of the drain electrode TE1 of the first transistor T1 may be partially exposed by etching the 1-2-th contact hole CH12. The upper surface of the driving voltage line DVL may be partially exposed by etching the 2-2-th contact hole CH22. The 1-2-th contact hole CH12 along with the 1-1-th contact hole CH11 may form the first contact hole CH1. The 2-2-th contact hole CH22 along with the 2-1-th contact hole CH21 may form the second contact hole CH2.

A width W5 of an upper end of the 1-2-th contact hole CH12 may be less than a width W6 of the first contact opening OP1. A width W7 of an upper end of the 2-2-th contact hole CH22 may be less than a width W8 of the second contact opening OP2. In other words, the width W6 of the first contact opening OP1 may be greater than the width W5 of the upper end of the 1-2-th contact hole CH12. The width W8 of the second contact opening OP2 may be greater than the width W7 of the upper end of the 2-2-th contact hole CH22.

Hence, even when the pixel electrode layer PE and the data conductor SD are coupled through the first contact hole CH1 and the second contact hole CH2, the pixel electrode layer PE extending into the first contact hole CH1 and the second contact hole CH2 may be spaced apart from the shielding electrode SHI, so that the shielding electrode SHI and the pixel electrode layer PE may be prevented from undesirably short-circuiting.

Figure 12:
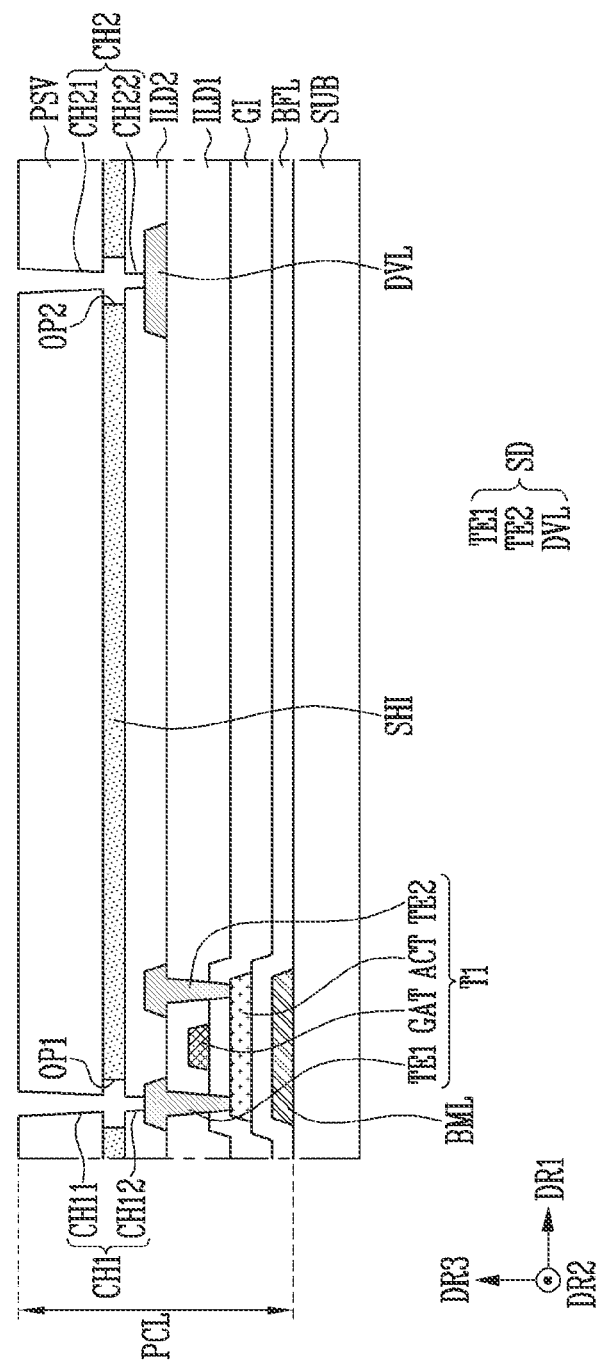

Referring to FIG. 12, the photoresist (PR) pattern on the passivation layer PSV may be removed.

Referring again to FIG. 6, the bank pattern BNKP is formed on the passivation layer PSV. The bank pattern BNKP may be formed of two bank patterns BNKP that are spaced apart from each other.

Thereafter, the first electrode EL1 and the second electrode EL2 are respectively formed on the two bank patterns BNKP. The first contact hole CH1 is filled with material that forms the first electrode EL1. The second contact hole CH2 is filled with material that forms the second electrode EL2. Hence, the first electrode EL1 may be physically and/or electrically coupled with the drain electrode TE1 of the first transistor T1 through the first contact hole CH1. The driving voltage line DVL may be physically and/or electrically coupled with the second electrode EL2 through the second contact hole CH2.

The first electrode EL1 and the second electrode EL2 are formed at positions spaced apart from each other in the first direction DR1. The first insulating layer INS1 is formed between the first electrode EL1 and the second electrode EL2 that are spaced apart from each other. The first insulating layer INS1 may be formed on the first electrode EL1 and the second electrode EL2 to overlap at least a portion of the first electrode EL1 and at least a portion of the second electrode EL2

The bank BNK is formed on some areas of the upper surface of the passivation layer PSV, the upper surface of the first electrode EL1, and the upper surface of the second electrode EL2. The bank BNK may be formed outside the emission area. A solution (e.g., a predetermined solution) including light emitting elements LD may be input into space between the banks BNK.

The solution including the light emitting elements LD may be sprayed onto the first electrode EL1 and the second electrode EL2 by an inkjet scheme or the like.

If alignment voltages (or alignment signals) are applied to the first electrode EL1 and the second electrode EL2 after the solution has been sprayed, an electric field is formed between the first electrode EL1 and the second electrode EL2, so that the light emitting elements LD may be aligned between the first electrode EL1 and the second electrode EL2. After the light emitting elements LD have been aligned, the solution may be removed by a volatilization scheme or other schemes. In this way, the light emitting elements LD may be reliably arranged between the first electrode EL1 and the second electrode EL2.

The first electrode EL1 is electrically coupled with the first transistor T1, and the second electrode EL2 is electrically coupled with the driving voltage line DVL. Hence, when alignment voltages are applied to the first electrode EL1 and the second electrode EL2, a capacitance may be formed between the first electrode EL1 and the first transistor T1 and/or between the second electrode EL2 and the driving voltage line DVL, and an electric field may be formed therebetween. Here, because the first electrode EL1 and the first transistor T1 differ in size and/or position from each other, and the second electrode EL2 and the driving voltage line DVL differ in size and/or position from each other, crosstalk, a difference in electric field, etc. may be caused by the capacitance formed between the two electrodes (or lines).

In some embodiments, the shielding electrode SHI is located between the first electrode EL1 and the drain electrode TE1 of the first transistor T1, and the shielding electrode SHI is located between the second electrode EL2 and the driving voltage line DVL. Therefore, crosstalk, a difference in electric field, etc. may be reduced or prevented from occurring due to the capacitance formed between the two electrodes (or lines).

Hereinafter, the structure of a display device in accordance with some embodiments will be described with reference to FIGS. 13 and 18.

Figure 13:
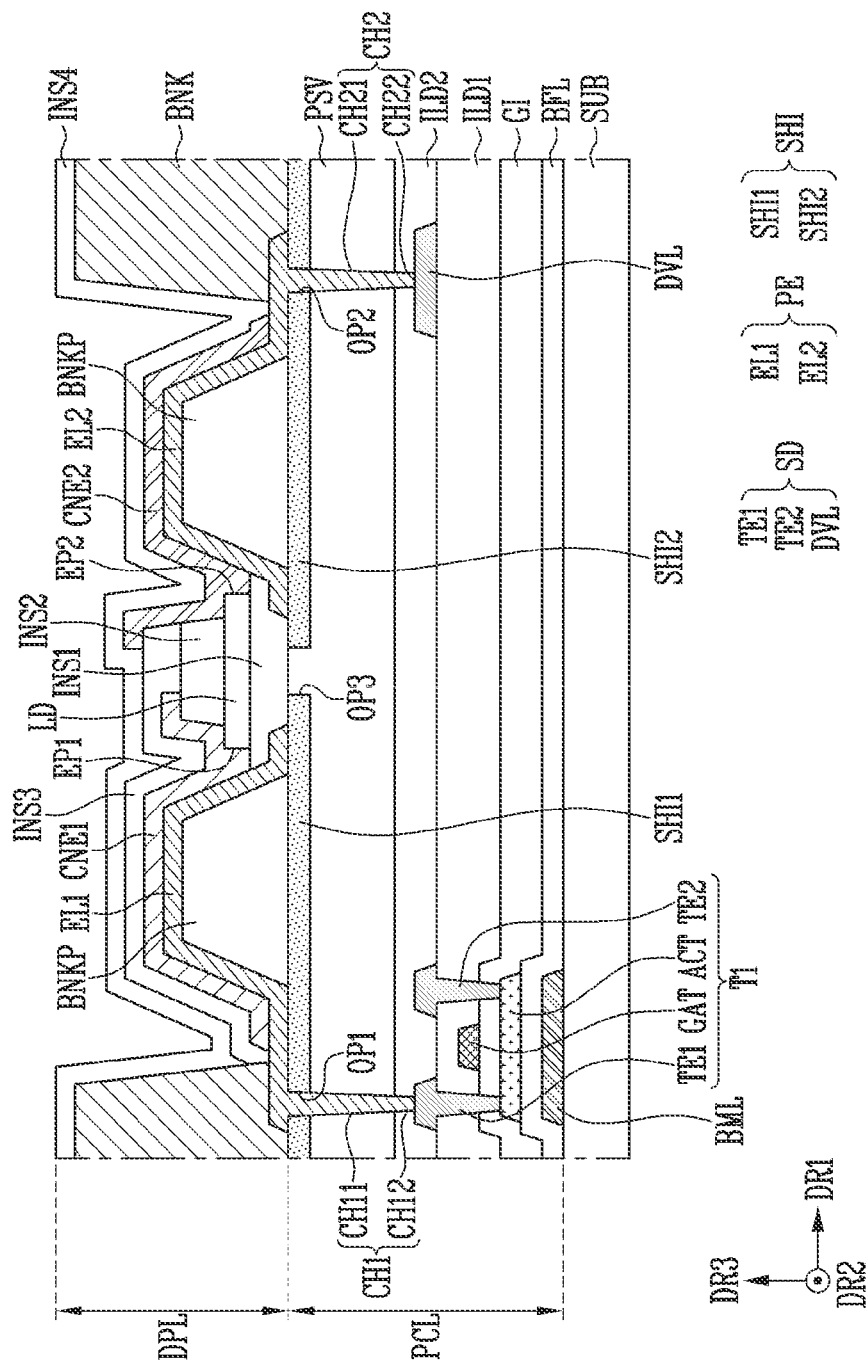
FIG. 13 is a sectional view of the display device in accordance with some embodiments.

FIG. 13 is a sectional view of the display device in accordance with some embodiments, and FIGS. 14 to 18 are sectional views schematically illustrating a method of manufacturing the display device in accordance with some embodiments The display device of FIG. 13 is similar to the display device shown in FIG. 6, and repetitive explanations may be omitted in the following description.

Referring to FIG. 13, the display device may include a substrate SUB, a pixel circuit layer PCL, and a display element layer DPL.

The substrate SUB may be a rigid substrate or a flexible substrate, and a substrate including transparent insulating material to allow light to transmit therethrough.

The pixel circuit layer PCL may include a bottom metal layer BML, a buffer layer BFL, a first transistor T1, a data conductor SD, a plurality of insulating layers GI, ILD1, and ILD2, a passivation layer PSV, and a shielding electrode SHI.

The bottom metal layer BML may be located between the substrate SUB and the buffer layer BFL. The bottom metal layer BML may be included in the first transistor T1.

The buffer layer BFL may cover the substrate SUB and the bottom metal layer BML, and may be located on the substrate SUB. The buffer layer BFL may reduce or prevent impurities diffusing into the pixel circuit layer PCL. The buffer layer BFL may be an inorganic insulating layer formed of inorganic material.

The first transistor T1 may include a semiconductor layer ACT, a gate electrode GAT, a drain electrode TE1, and a source electrode TE2. In some embodiments, the drain electrode TE1 and the source electrode TE2 may be switched with each other.

The semiconductor layer ACT may be located on the buffer layer BFL. The semiconductor layer ACT may include a drain area coupled to the drain electrode TE1, a source area coupled to the source electrode TE2, and a channel area between the drain area and the source area. The channel area may overlap with the gate electrode GAT of the first transistor T1. The semiconductor layer ACT may be a semiconductor pattern formed of poly silicon, amorphous silicon, an oxide semiconductor, etc.

The gate insulating layer GI may be located on the semiconductor layer ACT to cover the semiconductor layer ACT and the buffer layer BFL. The gate insulating layer GI may be an inorganic insulating layer including inorganic material.

The gate electrode GAT may be located on the gate insulating layer GI to overlap with the channel area of the semiconductor layer ACT.

A first interlayer insulating layer ILD1 may be located on the gate electrode GAT to cover the gate electrode GAT and the gate insulating layer GI. The first interlayer insulating layer ILD1 may include respective contact holes to be used to couple the drain electrode TE1 of the first transistor T1 and the source electrode TE2 of the first transistor T1 to the drain area and the source area of the semiconductor layer ACT, respectively.

The data conductor SD that includes the drain electrode TE1 of the first transistor T1, the source electrode TE1 of the first transistor T1, and the driving voltage line DVL may be located on the first interlayer insulating layer ILD1.

The drain electrode TE1 and the source electrode TE2 may be respectively coupled to the source area and the drain area of the semiconductor layer ACT through contact holes that successively pass through the gate insulating layer GI and the first interlayer insulating layer ILD1.

The driving voltage line DVL may have the same configuration as that of the second power line PL2 described with reference to FIG. 2. Hence, the voltage of the second power supply VSS may be applied to the driving voltage line DVL.

The second interlayer insulating layer ILD2 may be located on the first interlayer insulating layer ILD1 to cover the first interlayer insulating layer ILD1 and the data conductor SD. The second interlayer insulating layer ILD2 may be an inorganic insulating layer including inorganic material or an organic insulating layer including organic material.

The second interlayer insulating layer ILD2 may include a 1-2-th contact hole CH12 that exposes the drain electrode TE1 of the first transistor T1, and a 2-2-th contact hole CH22 that exposes the driving voltage line DVL. The 1-2-th contact hole CH12 along with a 1-1-th contact hole CH11 to be described below may form the first contact hole CH1. The drain electrode TE1 of the first transistor T1 may be physically and/or electrically coupled with the first electrode EL1 through the first contact hole CH1. The 2-2-th contact hole CH22 along with 2-1-th contact hole CH21 to be described below may form the second contact hole CH2. The driving voltage line DVL may be physically and/or electrically coupled with the second electrode EL2 through the second contact hole CH2.

The passivation layer PSV is located on the second interlayer insulating layer ILD2 to cover the second interlayer insulating layer ILD2. The passivation layer PSV may include an inorganic insulating layer and/or an organic insulating layer. The passivation layer PSV may include a 1-1-th contact hole CH11 that exposes the drain electrode TE1 of the first transistor T1, and a 2-1-th contact hole CH21 that exposes the driving voltage line DVL. The 1-1-th contact hole CH11 along with the 1-2-th contact hole CH12 described above may form the first contact hole CH1. The drain electrode TE1 of the first transistor T1 may be physically and/or electrically coupled with the first electrode EL1 through the first contact hole CH1. The 2-1-th contact hole CH21 along with 2-2-th contact hole CH22 described above may form the second contact hole CH2. The driving voltage line DVL may be physically and/or electrically coupled with the second electrode EL2 through the second contact hole CH2.

The shielding electrode SHI may be located on the passivation layer PSV. The shielding electrode SHI may include a first contact opening OP1, a second contact opening OP2, and an emission opening OP3.

The first contact opening OP1 may expose a portion of an upper surface of the drain electrode TE1 of the first transistor T1. In the first contact opening OP1, the drain electrode TE1 of the first transistor T1 may be physically and/or electrically coupled with the first electrode EL1 through the first contact hole CH1.

The first contact opening OP1 may have a width that is greater than that of an upper end of the first contact hole CH1 so that the first contact opening OP1 may be appropriately spaced, in the first direction DR1 and the second direction DR2, apart from the first electrode EL1 extending into the first contact hole CH1. Hence, even when the pixel electrode layer PE and the data conductor SD are coupled through the first contact hole CH1, the pixel electrode layer PE extending into the first contact hole CH1 may be spaced apart from the shielding electrode SHI, so that a likelihood of the shielding electrode SHI and the pixel electrode layer PE undesirably short-circuiting may be reduced or prevented.

The second contact opening OP2 may expose a portion of an upper surface of the driving voltage line DVL. In the second contact opening OP2, the driving voltage line DVL may be physically and/or electrically coupled with the second electrode EL2 through the second contact hole CH2.

The second contact opening OP2 may have a width that is greater than that of an upper end of the second contact hole CH2 so that the second contact opening OP2 may be appropriately spaced, in the first direction DR1 and the second direction DR2, apart from the second electrode EL2 extending into the second contact hole CH2. Hence, even when the pixel electrode layer PE and the data conductor SD are coupled through the second contact hole CH2, the pixel electrode layer PE extending into the second contact hole CH2 may be spaced apart from the shielding electrode SHI, so that a likelihood of the shielding electrode SHI and the pixel electrode layer PE undesirably short-circuiting may be reduced or prevented.

The emission opening OP3 may expose a portion of the upper surface of the passivation layer PSV. The emission opening OP3 may be located to at least partially overlap, in the third direction DR3, the light emission element LD to be described below. The shielding electrode SHI may include a first part SHI1 and a second part SHI2 that are electrically separated from each other with the emission opening OP3 interposed therebetween. The first part SHI1 and the second part SHI2 of the shielding electrode SHI may be separate components that are disconnected from each other.

The first part SHI1 of the shielding electrode SHI that is located on the left of the emission opening OP3 may come into direct contact with the first electrode EL1, and may be electrically coupled with the first electrode EL1. The second part SHI2 of the shielding electrode SHI that is located on the right of the emission opening OP3 may come into direct contact with the second electrode EL2, and may be electrically coupled with the second electrode EL2.

The emission opening OP3 may space the parts of the shielding electrode SHI located under the light emitting element LD apart from each other. Thus, even when the first part SHI1 of the shielding electrode SHI comes into direct contact with the first electrode EL1, and the second part SHI2 of the shielding electrode SHI comes into direct contact with the second electrode EL2, an undesired short-circuit between the first electrode EL1 and the second electrode EL2 when voltages are respectively applied to the first electrode EL1 and the second electrode EL2 may be avoided.

The shielding electrode SHI may float. The shielding electrode SHI may be located to generally cover the data conductor SD and the pixel electrode layer PE, with the exception of one or more areas (e.g., the first contact opening OP1 and the second contact opening OP2) at which the data conductor SD is coupled with the pixel electrode layer PE to be described below. Hence, crosstalk, a difference in electric field, etc. may be reduced or prevented from occurring due to a capacitance formed between the data conductor SD and the pixel electrode layer PE when alignment signals (or signals) are applied to the first electrode EL1 and the second electrode EL2. Therefore, when the light emitting element LD is aligned by applying an alignment voltage to the pixel electrode layer PE, a deviation in alignment of the light emitting element LD may be mitigated.

The shielding electrode SHI may include transparent metal material. For example, the shielding electrode SHI may include material such as indium tin oxide (ITO), indium zinc oxide (IZO), zinc oxide (ZnO), indium gallium zinc oxide (IGZO), aluminum doped zinc oxide (AZO), gallium doped zinc oxide (GZO), or zinc tin oxide (ZTO). The present disclosure is not limited thereto, and the shielding electrode SHI may include a conductive polymer such as PEDOT (poly(3,4-ethylenedioxythiophene)), or other conductive materials including carbon nanotubes or graphene. Furthermore, the shielding electrode SHI may include at least one of various metal materials including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof.

The display element layer DPL may be located on the shielding electrode SHI and the passivation layer PSV. The display element layer DPL may include a bank pattern BNKP, a pixel electrode layer PE, a bank BNK, a light emitting element LD, a first contact electrode CNE1, a second contact electrode CNE2, and a plurality of insulating layers INS1, INS2, INS3, and INS4.

The bank pattern BNKP may be located on the passivation layer PSV. The bank pattern BNKP may have a trapezoidal cross-section that is reduced in width from one surface (e.g., an upper surface) of the passivation layer PSV upward in the third direction DR3.

The pixel electrode layer PE including the first electrode EL1 and the second electrode EL2 may be located on the passivation layer PSV and the bank pattern BNKP.

The first electrode EL1 and the second electrode EL2 each may be formed of material having a reflectivity (e.g., a predetermined reflectivity) to enable light emitted from the light emitting element LD to travel in an image display direction (e.g., in the third direction DR3) of the display device.

The first electrode EL1 may be physically and/or electrically coupled with the drain electrode TE1 of the first transistor T1 through the first contact hole CH1. The second electrode EL2 may be physically and/or electrically coupled with the driving voltage line DVL through the second contact hole CH2.

The first electrode EL1 and the second electrode EL2 may be provided in shapes that are different from that of the data conductor SD. The first electrode EL1 and the second electrode EL2 may be provided at positions that are different from that of the data conductor SD. Hence, if a voltage is applied to the data conductor SD and a voltage is applied to the pixel electrode PE, a capacitance may occur between the data conductor SD and the pixel electrode layer PE, and a difference in electric field between areas may be caused.

In some embodiments, because the shielding electrode SHI is located between the pixel electrode layer PE and the data conductor SD, capacitance and an electric field difference may be reduced or prevented from occurring between the data conductor SD and the pixel electrode layer PE. Therefore, in some embodiments, the light emitting elements LD may be aligned in a desired way when the light emitting elements LD are aligned by applying an alignment voltage (or a signal) to the pixel electrode layer PE. In other words, a deviation in alignment of the light emitting elements LD may be mitigated.

In some embodiments, the first electrode EL1 comes into direct contact with the first part SHI1 of the shielding electrode SHI that is located on the left of the emission opening OP3, so that the first electrode EL1 may be implemented in a double layer structure. In this case, because line resistance of the first electrode EL1 is reduced, a delay of a signal to be applied to the first electrode EL1 may be mitigated or prevented. Furthermore, the second electrode EL2 comes into direct contact with the second part SHI2 of the shielding electrode SHI that is located on the right of the emission opening OP3, so that the second electrode EL2 may be implemented in a double layer structure. In this case, because line resistance of the second electrode EL2 is reduced, a delay of a signal to be applied to the second electrode EL2 may be mitigated or prevented.

The first insulating layer INS1 may be located on the passivation layer PSV to at least partially cover the first electrode EL1, the second electrode EL2, the shielding electrode SHI, and the passivation layer PSV. The passivation layer PSV may be located between the first electrode EL1 and the second electrode EL2 so that a likelihood of the first electrode EL1 and the second electrode EL2 short-circuiting with each other may be reduced or prevented. Furthermore, the likelihood of the first electrode EL1 and the second electrode EL2 short-circuiting with each other may be reduced or prevented due to the emission opening OP3 of the shielding electrode SHI.

The light emitting element LD may be located on the first insulating layer INS1. The first end EP1 of the light emitting element LD may be located to face the first electrode EL1. The second end EP2 of the light emitting element LD may be located to face the second electrode EL2. The first end EP1 of the light emitting element LD may at least partially overlap with the first electrode EL1 in the third direction DR3. The second end EP2 of the light emitting element LD may at least partially overlap with the second electrode EL2 in the third direction DR3

The bank BNK may be located on the passivation layer PSV. The bank BNK may be located to at least partially overlap with the first electrode EL1 and the second electrode EL2.

At the operation of supplying the light emitting elements LD to the emission area EMA, the bank BNK may be a dam structure configured to reduce or prevent a solution including the light emitting elements LD being drawn into the emission area EMA of an adjacent pixel PXL, or configured to control the amount of solution such that a constant amount of solution is supplied to each emission area EMA.

The second insulating layer INS2 may be located on each of the light emitting elements LD. The second insulating layer INS2 may be located on a portion of the upper surface of the light emitting element LD such that the first end EP1 and the second end EP2 of the light emitting element LD are exposed to the outside.

The first contact electrode CNE1 may be located on the first electrode EL1 to cover the first electrode EL1, and may be located to at least partially overlap with the first insulating layer INS1, the light emitting element LD, and the second insulating layer INS2.

The first contact electrode CNE1 may come into direct contact with the first end EP1 of the light emitting element LD and the first electrode EL1, and may physically and/or electrically reliably couple the first end EP1 of the light emitting element LD to the first electrode EL1.

The third insulating layer INS3 may be located on the second insulating layer INS2 and the first contact electrode CNE1 to cover the second insulating layer INS2 and the first contact electrode CNE1. The third insulating layer INS3 may be located such that a perimeter thereof comes into contact with one end of the second insulating layer INS2 so that the second end EP2 of the light emitting element LD is exposed.

The second contact electrode CNE2 may be located on the second electrode EL2 to cover the second electrode EL2, and may be located to at least partially overlap with the first insulating layer INS1, the light emitting element LD, and the third insulating layer INS3.

The second contact electrode CNE2 may come into direct contact with the second end EP2 of the light emitting element LD and the second electrode EL2, and may physically and/or electrically reliably couple the second end EP2 of the light emitting element LD to the second electrode EL2.

The fourth insulating layer INS4 may be located on the third insulating layer INS3, the second contact electrode CNE2, and the bank BNK to cover the third insulating layer INS3, the second contact electrode CNE2, and the bank BNK. The fourth insulating layer INS4 may be an inorganic insulating layer including inorganic material, or an organic insulating layer including organic material. For example, the fourth insulating layer INS4 may have a structure formed by alternately stacking at least one inorganic insulating layer and at least one organic insulating layer. The fourth insulating layer INS4 may cover the entirety of the display element layer DPL, and may reduce or prevent water or moisture being drawn from the outside into the display element layer DPL including the light emitting elements LD.

Figure 14:
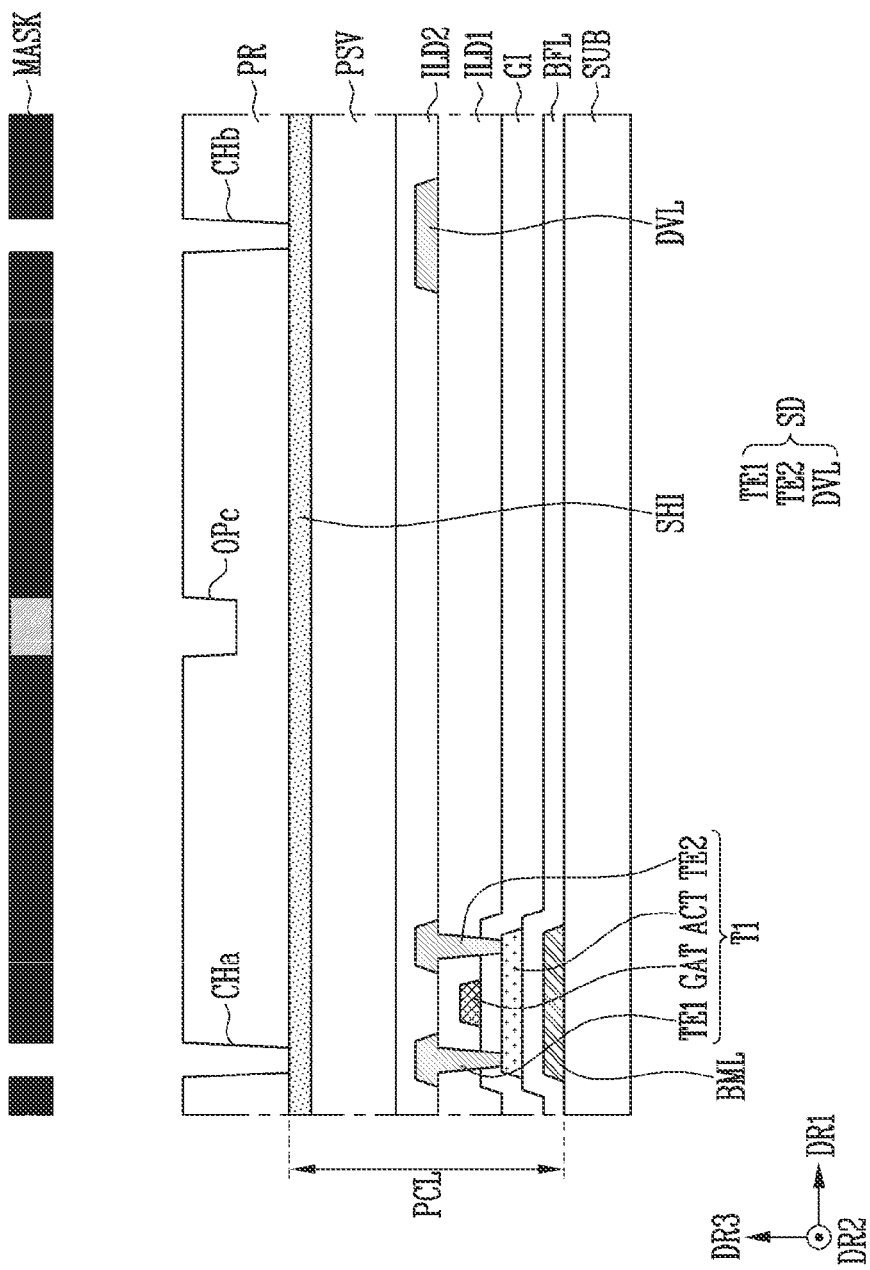
FIGS. 14 to 18 are sectional views schematically illustrating a method of manufacturing the display device in accordance with some embodiments.

Referring to FIG. 14, the bottom metal layer BML, the buffer layer BFL, the semiconductor layer ACT, the gate insulating layer GI, the gate electrode GAT, the first interlayer insulating layer ILD1, the data conductor SD, the second interlayer insulating layer ILD2, and the shielding electrode SHI are successively formed on the substrate SUB.

A photoresist PR is applied to the entirety of the upper surface of the shielding electrode SHI. A first opening pattern Cha, a second opening pattern CHb, and a third opening pattern OPc are formed by etching portions of the photoresist PR.

The first opening pattern CHa of the photoresist PR may correspond to a position at which the first contact hole CH1 (or the first contact opening OP1) is to be formed. The second opening pattern CHb of the photoresist PR may correspond to a position at which the second contact hole CH2 (or the second contact opening OP2) is to be formed. The third opening pattern OPc of the photoresist PR may correspond to a position at which the emission opening OP3 is to be formed.

The first opening pattern CHa, the second opening pattern CHb, and the third opening pattern OPc may be formed to different depths using a half tone mask MASK. For example, the depths to which the first opening pattern CHa and the second opening pattern CHb are formed may be greater than the depth to which the third opening pattern OPc is formed.

Hence, the first opening pattern CHa and the second opening pattern CHb may expose portions of the upper surface of the shielding electrode SHI. On the other hand, the third opening pattern OPc may be formed in the photoresist (PR) pattern, rather than exposing a portion of the upper surface of the shielding electrode SHI.

Figure 15:
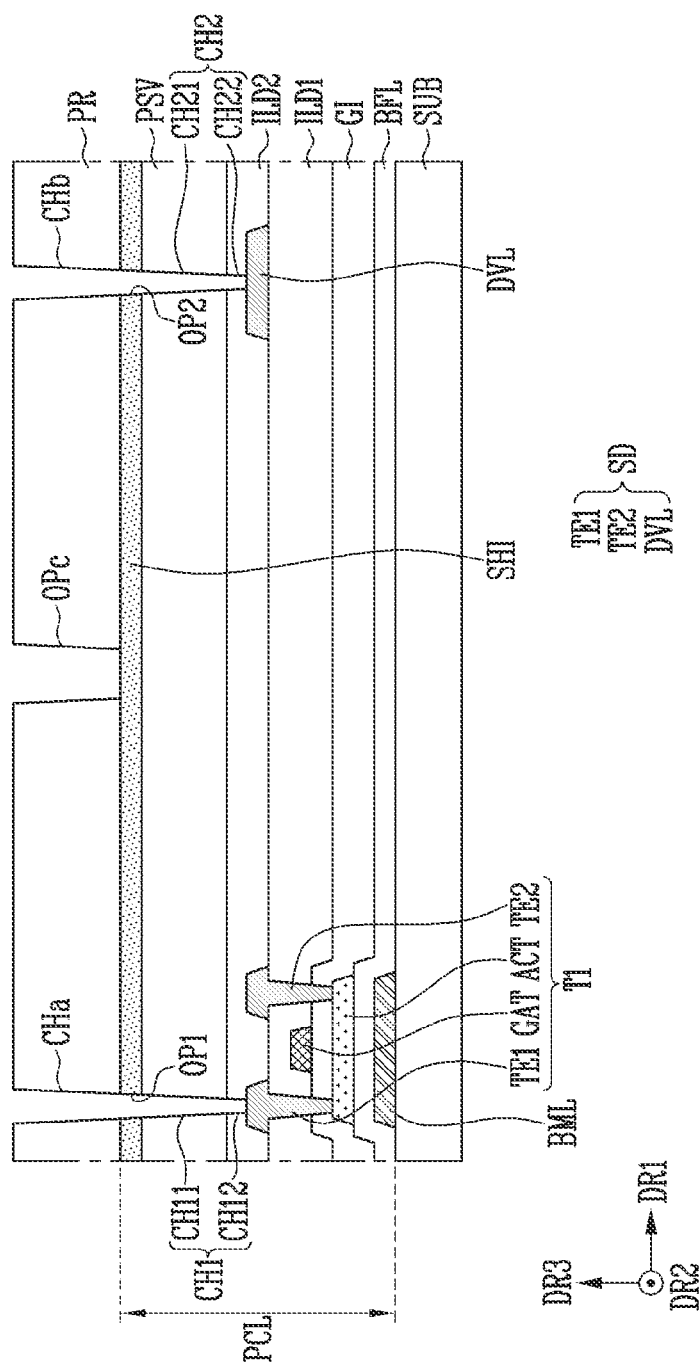

Referring to FIG. 15, the first contact opening OP1 and the second contact opening OP2 of the shielding electrode SHI are etched, the passivation layer PSV is partially etched, and the second interlayer insulating layer ILD2 is partially etched. For example, a 1-1-th contact hole CH11 and a 2-1-th contact hole CH21 are formed by partially etching the passivation layer PSV. A 1-2-th contact hole CH12 and a 2-2-th contact hole CH22 are formed by partially etching the second interlayer insulating layer ILD2.

Furthermore, the third opening pattern OPc of the photoresist (PR) pattern may also be etched so that a portion of the upper surface of the shielding electrode SHI may be exposed.

The first contact opening OP1 and the second contact opening OP2 of the shielding electrode SHI may be formed through a dry etching process. The 1-1-th contact hole CH11 and the 2-1-th contact hole CH21 of the passivation layer PSV may be formed through a wet etching process. Furthermore, the 1-2-th contact hole CH12 and the 2-2-th contact hole CH22 of the second interlayer insulating layer ILD2 may be formed through a wet etching process. The 1-1-th contact hole CH11 and the 1-2-th contact hole CH12 may form the first contact hole CH1. The 2-1-th contact hole CH21 and the 2-2-th contact hole CH22 may form the second contact hole CH2.

A cross-section of the first contact opening OP1 may be located on a line identical with that of the first contact hole CH1 (e.g., respective surfaces defining the first contact opening OP1 and the first contact hole CH1 may be aligned). A cross-section of the second contact opening OP2 may be located on a line identical with that of the second contact hole CH2. In other words, the 1-1-th contact hole CH11 may extend from the first contact opening OP1. The 1-2-th contact hole CH12 may extend from the 1-1-th contact hole CH11. The 2-1-th contact hole CH21 may extend from the second contact opening OP2. The 2-2-th contact hole CH22 may extend from the 2-1-th contact hole CH21.

Figure 16:
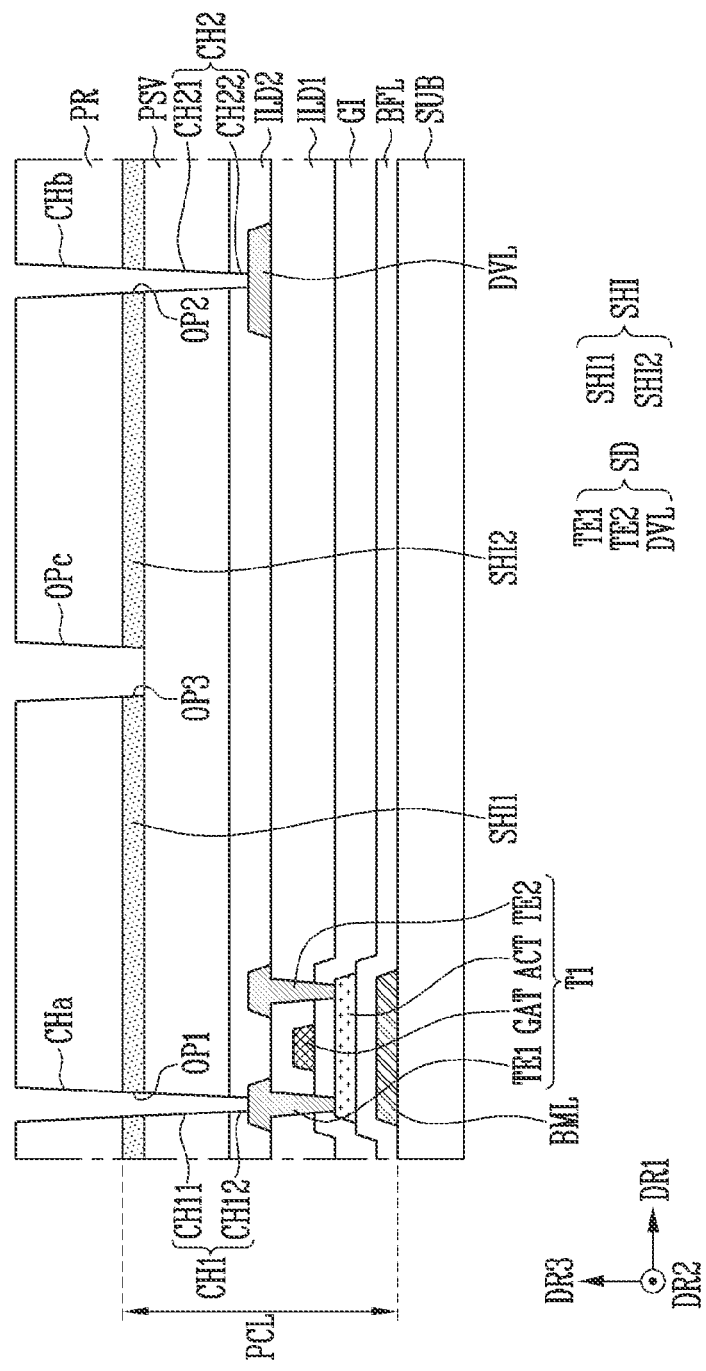

Referring to FIG. 16, the emission opening OP3 is formed by partially etching the shielding electrode SHI. The emission opening OP3 of the shielding electrode SHI may be formed through a dry etching process.

The emission opening OP3 may extend from the third opening pattern OPc. As the emission opening OP3 is formed, the shielding electrode SHI may include a first part SHI1 and a second part SHI2, and a portion of the upper surface of the passivation layer PSV may be exposed.

Figure 17:
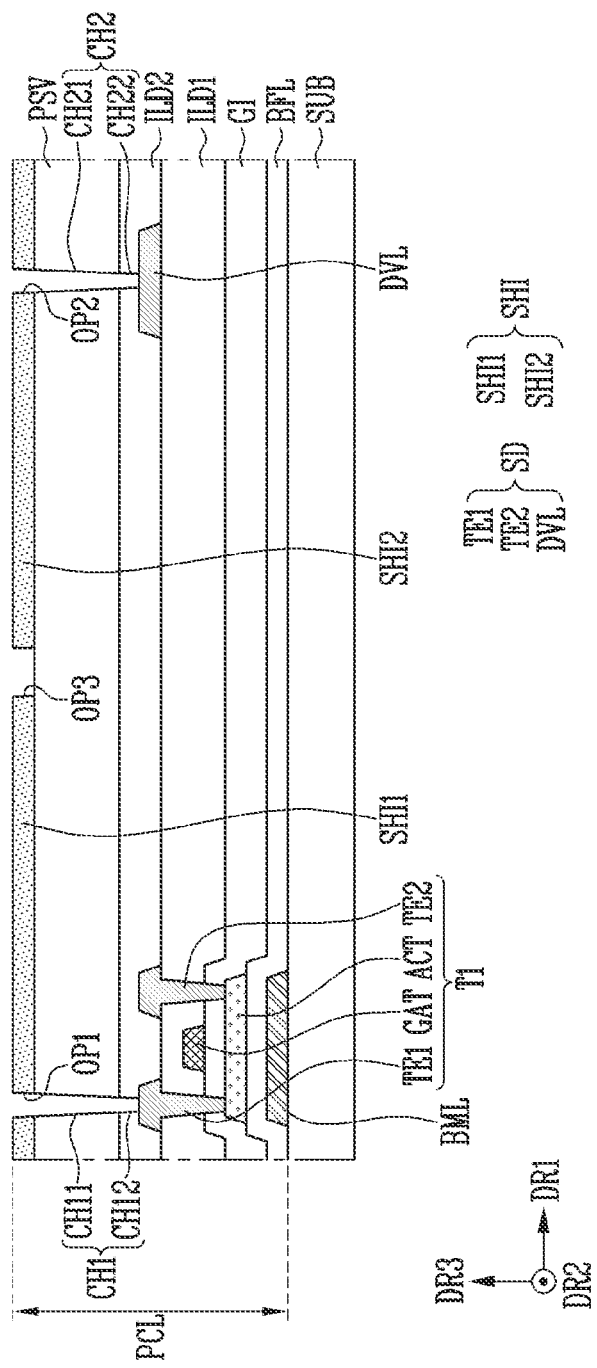

Referring to FIG. 17, the pattern of the photoresist (PR) on the shielding electrode SHI is removed.

Figure 18:
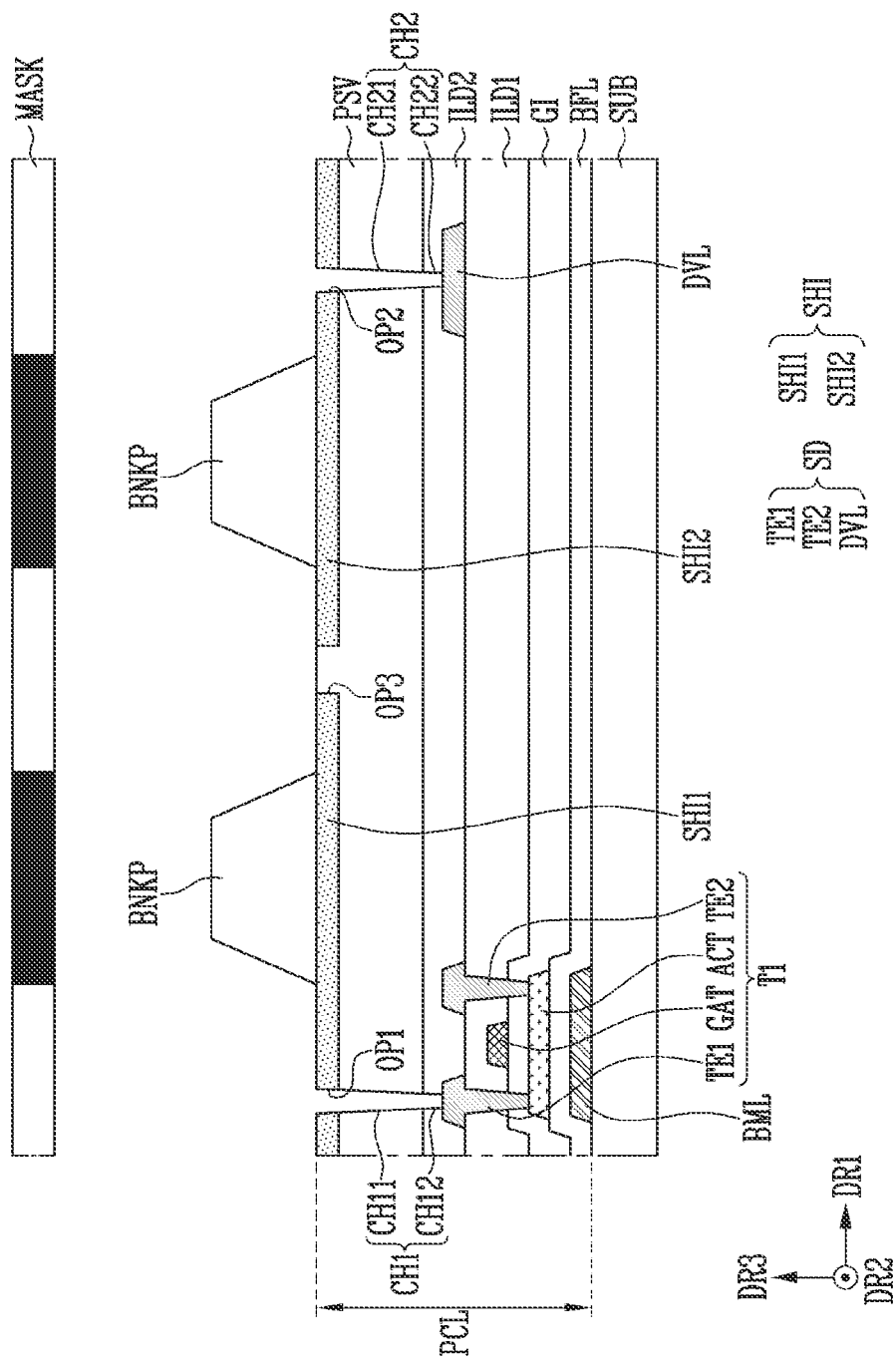

Referring to FIG. 18, material for the bank pattern BNKP is applied to the upper surface of the shielding electrode SHI, and the bank pattern BNKP is formed using a half tone mask MASK.

The bank pattern BNKP may be formed of two bank patterns BNKP that are spaced apart from each other.

Thereafter, referring again to FIG. 13, the first electrode EL1 and the second electrode EL2 are formed on the bank pattern BNKP. The bank BNK is formed on some areas of the upper surface of the passivation layer PSV, the upper surface of the first electrode EL1, and the upper surface of the second electrode EL2.

A method of forming the display element layer DPL including the bank pattern BNKP, the first electrode EL1, the second electrode EL2, the bank BNK, the light emitting element LD, the first contact electrode CNE1, the second contact electrode CNE2, and the plurality of insulating layers INS1, INS2, INS3, and INS4 is identical with the method of forming the display element layer DPL described above with reference to FIG. 6, therefore, further explanation thereof will be omitted.

In the display device described with reference to FIGS. 13 to 18, because the shielding electrode SHI is located between the pixel electrode layer PE and the data conductor SD, capacitance and an electric field difference between the data conductor SD and the pixel electrode layer PE may be reduced or prevented. Therefore, in some embodiments, the light emitting elements LD may be aligned in a desired way when the light emitting elements LD are aligned by applying an alignment voltage (or a signal) to the pixel electrode layer PE. In other words, a deviation in alignment of the light emitting elements LD may be mitigated.

Furthermore, the likelihood of the first electrode EL1 and the second electrode EL2 short-circuiting with each other may be reduced or prevented by the emission opening OP3 of the shielding electrode SHI.

As described above, in embodiments, a shielding electrode may be located between a data conductor and a pixel electrode layer so that an electric field may be reduced or prevented from being formed between the data conductor and the pixel electrode layer when light emitting elements are aligned. Thus, a deviation in alignment between light emitting elements may be mitigated.

The effects of the present disclosure are not limited by the foregoing, and other various effects are anticipated herein.

While various embodiments have been described above, those skilled in the art will appreciate that various modifications, additions and substitutions are possible, without departing from the scope and spirit of the present disclosure.

Therefore, the embodiments disclosed in this specification are only for illustrative purposes rather than limiting the technical spirit of the present disclosure. The scope of the present disclosure must be defined by the accompanying claims, with functional equivalents thereof to be included therein.

What is claimed is:

1. A display device comprising:
    a substrate;
    a first interlayer insulating layer on the substrate;
    a data conductor on the first interlayer insulating layer;
    a passivation layer on the data conductor;
    a pixel electrode layer on the passivation layer; and
    a shielding electrode between the data conductor and the pixel electrode layer, and defining a first contact opening and a second contact opening,
    wherein the data conductor and the pixel electrode layer are electrically coupled to each other in each of the first contact opening and the second contact opening.

2. The display device according to claim 1, wherein the data conductor comprises a drain electrode of a first transistor, and a driving voltage line,
    wherein the pixel electrode layer comprises a first electrode and a second electrode,
    wherein, in the first contact opening, the drain electrode of the first transistor and the first electrode are electrically coupled to each other through a first contact hole, and
    wherein, in the second contact opening, the driving voltage line and the second electrode are electrically coupled to each other through a second contact hole.

3. The display device according to claim 2, further comprising a second interlayer insulating layer between the first interlayer insulating layer and the passivation layer,
    wherein the second interlayer insulating layer covers the first interlayer insulating layer and the data conductor, and
    wherein the shielding electrode is between the second interlayer insulating layer and the passivation layer.

4. The display device according to claim 3, wherein the passivation layer defines a 1-1-th contact hole and a 2-1-th contact hole,
wherein the second interlayer insulating layer defines a 1-2-th contact hole and a 2-2-th contact hole,
wherein the first contact hole comprises the 1-1-th contact hole and the 1-2-th contact hole, and
wherein the second contact hole comprises the 2-1-th contact hole and the 2-2-th contact hole.

5. The display device according to claim 2, further comprising a second interlayer insulating layer between the first interlayer insulating layer and the passivation layer, and covering the first interlayer insulating layer and the data conductor,
wherein the shielding electrode is between the passivation layer and the pixel electrode layer.

6. The display device according to claim 5, further comprising a light emitting element between the first electrode and the second electrode, and having a first end electrically coupled with the first electrode, and a second end electrically coupled with the second electrode.

7. The display device according to claim 6, wherein, in a sectional view, the shielding electrode further comprises an emission opening at least partially overlapping with the light emitting element.

8. The display device according to claim 7, wherein the shielding electrode comprises a first part and a second part around the emission opening, the first part being electrically coupled with the first electrode, and the second part being electrically coupled with the second electrode.

9. A display device comprising:
a substrate comprising an emission area and a non-emission area;
a first interlayer insulating layer on the substrate;
a data conductor on the first interlayer insulating layer;
a passivation layer on the data conductor;
a pixel electrode layer on the passivation layer; and
a shielding electrode between the data conductor and the pixel electrode layer, defining a first contact opening and a second contact opening, and located in the emission area and the non-emission area except the first contact opening and the second contact opening.

10. The display device according to claim 9, wherein the data conductor comprises a drain electrode of a first transistor and a driving voltage line,
wherein the pixel electrode layer comprises a first electrode and a second electrode,
wherein, in the first contact opening, the drain electrode of the first transistor and the first electrode are electrically coupled to each other through a first contact hole, and
wherein, in the second contact opening, the driving voltage line and the second electrode are electrically coupled to each other through a second contact hole.

11. The display device according to claim 10, wherein, in a plan view, the first contact opening encloses the first contact hole, and
wherein, in a plan view, the second contact opening encloses the second contact hole.

12. The display device according to claim 9, further comprising a second interlayer insulating layer between the first interlayer insulating layer and the passivation layer, and covering the first interlayer insulating layer and the data conductor,
wherein the shielding electrode is between the second interlayer insulating layer and the passivation layer.

13. The display device according to claim 9, further comprising a second interlayer insulating layer between the first interlayer insulating layer and the passivation layer, and covering the first interlayer insulating layer and the data conductor,
wherein the shielding electrode is between the passivation layer and the pixel electrode layer.

14. The display device according to claim 13, further comprising a light emitting element between a first electrode and a second electrode of the pixel electrode layer,
wherein a first end of the light emitting element is electrically coupled with the first electrode, and
wherein a second end of the light emitting element is electrically coupled with the second electrode.

15. The display device according to claim 14, wherein, in a sectional view, the shielding electrode defines an emission opening at least partially overlapping with the light emitting element.

16. The display device according to claim 15, wherein the shielding electrode comprises a first part and a second part around the emission opening, the first part being electrically coupled with the first electrode, and the second part being electrically coupled with the second electrode.

17. A method of manufacturing a display device, comprising:
forming a data conductor on a substrate, the data conductor comprising a drain electrode of a first transistor, and a driving voltage line;
forming an interlayer insulating layer covering the data conductor;
forming a shielding electrode on the interlayer insulating layer;
forming a passivation layer on the shielding electrode;
forming a portion of a first contact hole and a portion of a second contact hole by etching the passivation layer;
forming a first contact opening and a second contact opening by etching the shielding electrode;
completing formation of the first contact hole and the second contact hole by etching the interlayer insulating layer; and
forming a display element layer on the passivation layer, the display element layer comprising a first electrode coupled to the drain electrode of the first transistor through the first contact hole in the first contact opening, and a second electrode coupled to the driving voltage line through the second contact hole in the second contact opening.

18. The method according to claim 17, wherein a width of the first contact opening is greater than a width of the portion of the first contact hole, and
wherein a width of the second contact opening is greater than a width of the portion of the second contact hole.

19. The method according to claim 17, further comprising:
spraying a solution comprising a light emitting element onto the first electrode and the second electrode; and
applying respective alignment voltages to the first electrode and the second electrode.

20. The method according to claim 19, wherein a first end of the light emitting element is electrically coupled with the first electrode, and
wherein a second end of the light emitting element is electrically coupled with the second electrode.

* * * * *